(12) United States Patent
Sungkorn et al.

(10) Patent No.: US 11,530,998 B2
(45) Date of Patent: Dec. 20, 2022

(54) METHOD AND SYSTEM TO ANALYZE GEOLOGIC FORMATION PROPERTIES

(71) Applicant: HALLIBURTON ENERGY SERVICES, INC., Houston, TX (US)

(72) Inventors: Radompon Sungkorn, Katy, TX (US); Jonas Toelke, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 52 days.

(21) Appl. No.: 16/711,022

(22) Filed: Dec. 11, 2019

(65) Prior Publication Data

US 2020/0225177 A1 Jul. 16, 2020

Related U.S. Application Data

(60) Provisional application No. 62/790,968, filed on Jan. 10, 2019.

(51) Int. Cl.
G01N 24/08 (2006.01)
G01V 11/00 (2006.01)

(52) U.S. Cl.
CPC ......... *G01N 24/081* (2013.01); *G01V 11/002* (2013.01)

(58) Field of Classification Search
CPC ...... G01N 24/081; G01V 11/002; G01V 3/18; G01R 33/5608
See application file for complete search history.

(56) References Cited

U.S. PATENT DOCUMENTS

| | | | |
|---|---|---|---|
| 2014/0074406 A1 | 3/2014 | Skelt | |
| 2014/0177390 A1 | 6/2014 | Can et al. | |
| 2014/0297186 A1* | 10/2014 | Suzrez-Rivera | G01N 31/00 |
| 2016/0307312 A1* | 10/2016 | Sungkorn | G06T 7/0004 |
| 2017/0020090 A1* | 7/2017 | Bhattiprolu | G06T 11/003 |
| 2017/0200290 A1 | 7/2017 | Bhattiprolu et al. | |
| 2018/0195979 A1 | 7/2018 | Li et al. | |
| 2020/0143139 A1* | 5/2020 | Paz | G06K 9/0063 |

OTHER PUBLICATIONS

"Ye Zhang: "Automated Classification Analysis of Geological Structures Based on Images Data and Deep Learning Model", Applied Sciences", Dec. 4, 2018. © 2018 by the authors; licensee MDPI, Basel, Switzerland. (Year: 2018). https://www.researchgate.net/publication/329410337_Automated_Classification_Analysis_of_Geological_Structures_Based_on_Images_Data_and_Deep_Learning_Model.*

International Search Report and Written Opinion for International application No. PCT/US2019/065813, dated Apr. 9, 2020, 11 pages.

Zhang et al., "Automated Classification Analysis of Geological Structures Based on Images Data and Deep Learning Model", Applied Sciences, Dec. 4, 2018, 16 pages.

* cited by examiner

*Primary Examiner* — Alessandro V Amari
*Assistant Examiner* — Lal C Mang
(74) *Attorney, Agent, or Firm* — Novak Druce Carroll LLP

(57) ABSTRACT

Systems and methods for determining properties of subterranean formations surrounding a wellbore are provided. An example method can include receiving an image of a formation sample; partitioning the image into a plurality of patches; detecting, via a semantic extraction processor, textures captured in the plurality of patches; associating the textures to a location of the image of the formation sample; reducing a dimension of representation of the textures to obtain one or more vectors, the one or more vectors being based on the textures; and providing a plurality of curves based on the one or more vectors.

22 Claims, 11 Drawing Sheets

METHOD AND SYSTEM TO ANALYZE GEOLOGIC FORMATION PROPERTIES

This application claims the benefit of U.S. Provisional Application No. 62/790,968, filed on Jan. 10, 2019, which is hereby incorporated by reference in its entirety.

FIELD

The present technology pertains to the evaluation of subterranean formations. In particular, the present disclosure relates to a system and method for evaluating various rock properties and textures of subterranean formations surrounding a wellbore.

BACKGROUND

Wellbores, such as those used in oil and gas extraction, are typically drilled into a geologic formation in a believed hydrocarbon bearing zone. However, the wellbore typically passes through several different formation types as it descends into the formation. Evaluation of the rock formations surrounding the wellbore allow for the most effective extraction locations to be selected. Typically, the formations surrounding the wellbore are evaluated using in a discrete manner, using a petrophysical analysis of a formation sample to identify a specific type of rock type or texture. Such formation samples can be obtained during the drilling process or through the use of wireline tools. Specifically, the geologic formation sample can be scanned and displayed as a photograph and then sections of the geologic formation sample can be classified qualitatively by visual inspection. The results obtained from the visual inspection are of a discrete value such as a single texture/rock type A, B, or C. Further usage of the discrete values cannot be used in conjunction with other available wellbore in such as rock density and electrical resistivity.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through die use of the accompanying drawings in which.

DETAILED DESCRIPTION

Figure 1A:
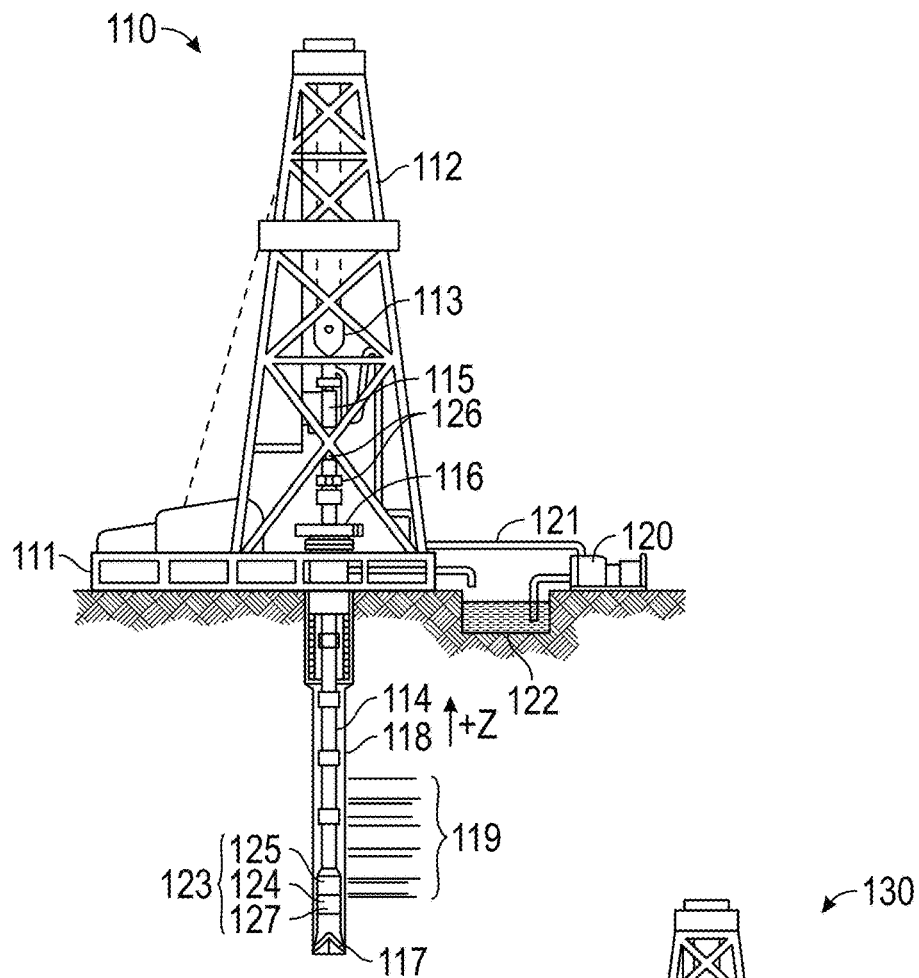
FIG. 1A is a schematic diagram of an exemplary drilling environment compatible with the systems and methods as described herein.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure. Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Introduction

Evaluation of downhole rock formations can be performed by carrying out imaging of samples obtained from a wellbore. The geologic formation sample can be obtained from within the wellbore via a downhole tool, such as a core extraction or wireline tool. Alternatively, the geologic formation sample can be obtained as the wellbore is drilled into the formation, such as a core sample or drill cuttings. In an alternative example, the geologic formation samples can be obtained after the wellbore has been drilled, such as core samples removed from the sidewall of a wellbore. The geologic formation samples can be removed from the wellbore and analyzed, using an x-ray, a computerized tomography (CT) scanner, or the like, to provide a visual representation, such as a graphical image, of the geologic formation sample material.

As described above, the image or scan of the sample can then be evaluated by viewing the image and assigning indicators, such as rock texture and rock type, based on the visual signature of the rock images. However, a visual inspection of the image can lead to inaccuracies due to the subjective nature of the inspection. Additionally, it can be very difficult to properly determine the texture of the rock based on a photograph or graphical representation and different formations can inaccurately be labeled as similar. For example, data obtained via conventional measurements such as well logs contain only an average value of the reservoir rock within a certain proximity of the measurement. The average value analysis can result in vastly different formations being labeled as though they are the same.

The present disclosure is drawn to a system and method for evaluating downhole rock formations based on an image of formation sample along with computer based extraction of textures from the sample to provide a more accurate analysis of the downhole environment. Specifically, the present disclosure relates to a method for using machine learning and deep neural networks to extract semantic representations of textures, which can then be classified according to rock type, then simplified into vector components representing different types of textures, and thereafter represented as curves to facilitate evaluation different groups of textures, and even small differences between textures within a particular grouping. The resulting curves based on the vector components can also be combined with other wellbore information/measurements such as rock density and electrical resistivity.

Exemplary Core Extraction and Imaging

Figure 1B:
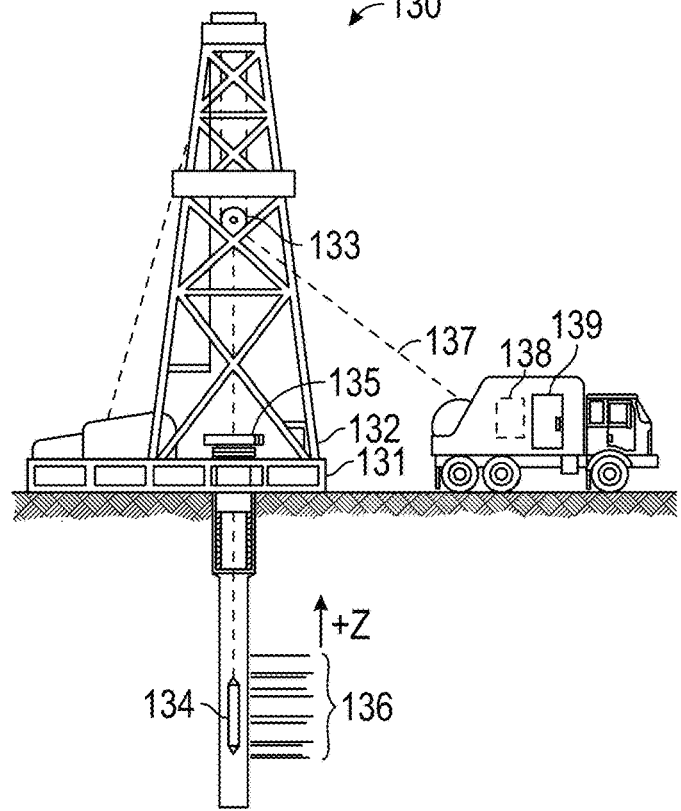
FIG. 1B is a schematic diagram of an exemplary conveyance wellbore environment compatible with the systems and methods as described herein.
Figure 1C:
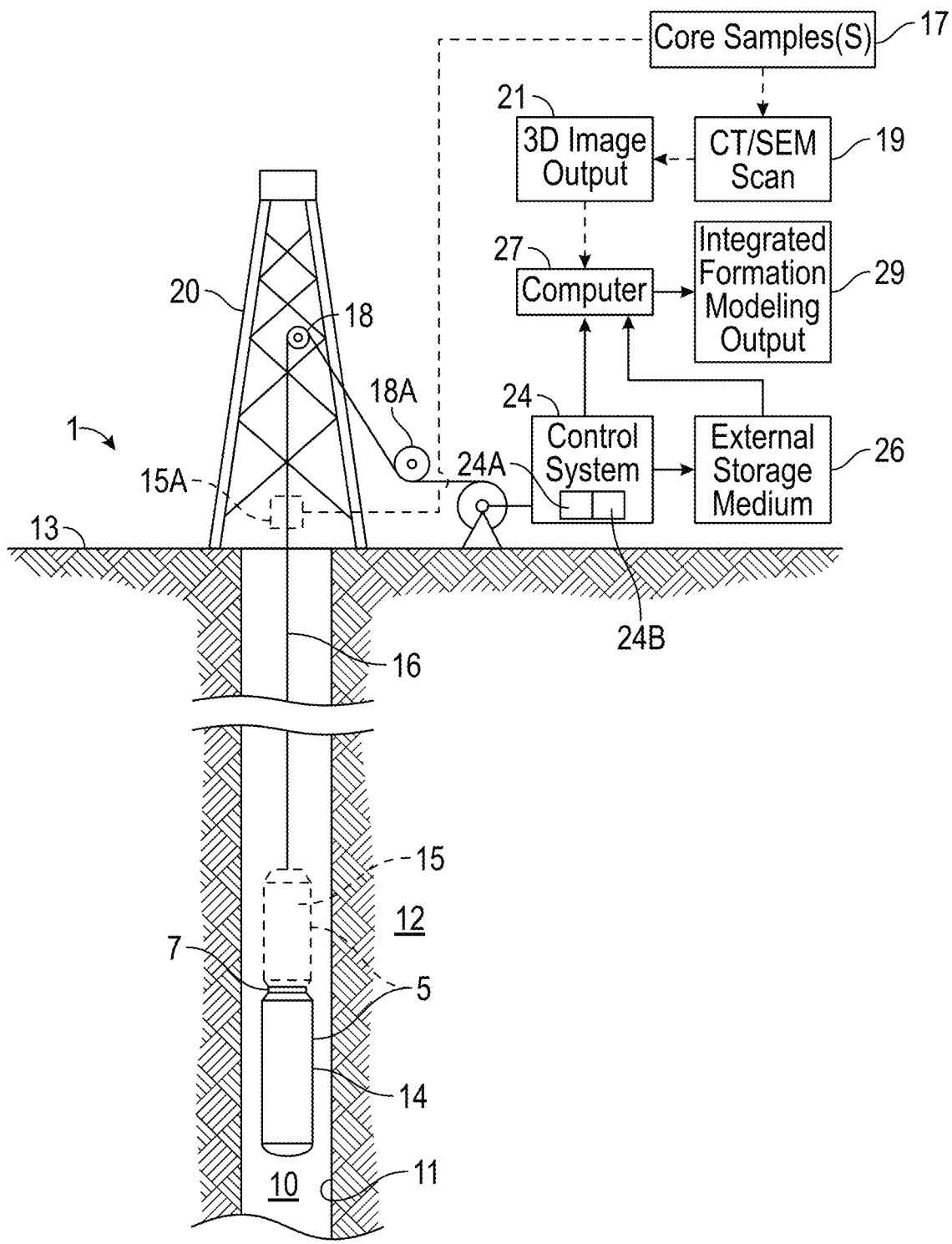
FIG. 1C is a schematic diagram of a system for core sample retrieval and 3D scanning analysis of a retrieved rock sample.

FIGS. 1A, 1B, and 1C illustrate exemplary environments compatible with the disclosed system and methods. For example, FIG. 1A illustrates a diagrammatic view of an exemplary logging while drilling (LWD) and/or measurement while drilling (MWD) wellbore system 110 which can be used to create a wellbore and gather geologic formation samples for rock formation analysis. As depicted in FIG. 1A, a drilling platform 111 is equipped with a derrick 112 that supports a hoist 113 for raising and lowering a drill string 114. The hoist 113 suspends a top drive 115 suitable for rotating the drill string 114 and lowering the drill string 114 through the well head 116. Connected to the lower end of the drill string 113 is a drill bit 117. As the drill bit 117 rotates, the drill bit 117 creates a wellbore 118 that passes through various formations 119. The drill string 114 can also include a sampling-while-drilling tool, operable to collect geologic formation samples of the various formations through which the drill passes for retrieval at the surface. In an alternative embodiment, analysis can be performed on drill cuttings retrieved at the surface of the wellbore. The wellbore 118 can be formed according to a desired well plan having one or more vertical, curved, and/or horizontal portions extending through one or more formations 119. This complexity of well construction leads to challenges in determining the amount and phase of the geologic formations surrounding the wellbore. A pump 120 circulates drilling fluid through a supply pipe 121 to top drive 115, down through the interior of chill string 114, through orifices in drill bit 117, back to the surface via the annulus around drill string 114, and into a retention pit 122. The drilling fluid transports cuttings from the wellbore 118 into the pit 122 and aids in maintaining the integrity of the wellbore 118. Various materials can be used for drilling fluid, including oil-based fluids and water-based fluids. As the cuttings from drilling are portions of the formation, they may be used as samples for scanning and imaging as disclosed herein.

As depicted in FIG. 1A, logging tools 124 are integrated into the bottom-hole assembly 123 near the drill bit 117. As the drill bit 117 extends the wellbore 118 through the formations 119, logging tools 124 collect measurements relating to various formation properties as well as the orientation of the tool and various other drilling conditions. The bottom hole assembly 123 can include one or more logging tools 124. In at least one embodiment, one of the logging tools 124 of the bottom hole assembly 123 can include a measurement device as described herein. The logging tools 124 may be used for imaging or otherwise scanning, or measuring the formation 119 for producing the images as disclosed herein for use with machine learning and deep neural networks. The bottom-hole assembly 123 may also include a telemetry sub 125 to transfer measurement data to a surface receiver 126 and to receive commands from the surface. In some embodiments, the telemetry sub 125 communicates with a surface receiver 126 using mud pulse telemetry. In other cases, the telemetry sub 125 does not communicate with the surface, but rather stores logging data for later retrieval at the surface when the logging assembly is recovered. Notably, one or more of the bottom-hole assembly 123, the logging tools 124, and the telemetry sub 125 may also operate using a non-conductive cable (e.g. slickline, etc.) with a local power supply, such as batteries and the like. When employing non-conductive cable, communication may be supported using, for example, wireless protocols (e.g. EM, acoustic, etc.) and/or measurements and logging data may be stored in local memory for subsequent retrieval at the surface, as is appreciated by those in the art.

Each of the logging tools 124 may include a plurality of tool components, spaced apart from each other, and communicatively coupled with one or more wires. The telemetry sub 125 may include wireless telemetry or logging capabilities, or both, such as to transmit or later provide information indicative of received bagging data to operators on the surface or for later access and data processing for the evaluation of fluid within the wellbore. The logging tools 124 may also include one or more computing devices 127 communicatively coupled with one or more of the plurality of tool components. The computing device 127 may be configured to control or monitor the performance of the tools 124, process logging data, and/or carry out the methods of the present disclosure.

In some embodiments, one or more of the logging tools 124 may communicate with a surface receiver 126, such as a wired drillpipe. In other cases, the one or more of the logging tools 124 may communicate with a surface receiver 126 by wireless signal transmission. In at least some cases, one or more of the logging tools 124 may receive electrical power from a wire that extends to the surface, including wires extending through a wired drillpipe. In at least some instances the methods and techniques of the present disclosure may be performed by a computing device (not shown) on the surface. In some embodiments, the computing device may be included in surface receiver 126. For example, surface receiver 126 of wellbore operating environment 110 at the surface may include one or more of wireless telemetry, processor circuitry, or memory facilities, such as to support substantially real-time processing of data received from one or more of the logging tools 124. In some embodiments, data is processed at some time subsequent to its collection, wherein the data may be stored on the surface at surface receiver 126, stored downhole in telemetry sub 125, or both, until it is retrieved for processing.

While FIG. 1A indicates that the wellbore is in the drilling stage, the methods and systems as described herein can be used at any point throughout the life of a wellbore. One example of such environment is shown in FIG. 1B.

FIG. 1B illustrates a diagrammatic view of a conveyance wellbore operating system 130 in which the present disclosure may be implemented. As depicted in FIG. 1B, a hoist 133 may be included as a portion of a platform 131 such as that coupled to derrick 132, and used with a conveyance 137 to raise or lower equipment such as wireline tool 134 into or out of a borehole surrounded by geologic formation 136. A conveyance 137 may provide a communicative coupling between the wireline tool 134 and a control or processing facility 139 at the surface. The conveyance 137 may include wires (one or more wires), slicklines, cables, or the like, as well as tubular conveyances such as coiled tubing, joint tubing, or other tubulars, and may include a downhole tractor. Additionally, power can be supplied via the conveyance 137 to meet power requirements of the tool. The wireline tool 134 may have a local power supply, such as batteries, downhole generator and the like. When employing non-conductive cable, coiled tubing, pipe string, or downhole tractor, communication may be supported using, for example, wireless protocols (e.g. EM, acoustic, etc.), and/or measurements and logging data may be stored in local memory for subsequent retrieval. In at least one embodiment, the wireline tool 134 can be operable to collect samples of the geologic formations throughout the wellbore. For example, core samples can be taken from various formations adjacent the wellbore as the wireline tool 134 moves throughout the length of the wellbore. The control or processing facility 139 may include a computing device 138 capable of carrying out the methods and techniques of the present disclosure, including collecting and analyzing data gathered by the wireline tool 134. In this manner, information about the rock formations adjacent the wellbore may be obtained by the analysis of geologic samples collected by the wireline tool 134 and processed by a computing device, such as computing device 138. In some embodiments, computing device 138 is equipped to process the received information in substantially real-time, while in some embodiments, computing device 138 can be equipped to store the received information for processing at some subsequent time. The computing device 138 can be a computing system as described in more detail with respect to FIGS. 10 and 11.

FIG. 1C illustrates a system 1 for retrieving core samples from a geologic formation for integrated 3D image analysis. A wellbore 10 is shown penetrating the geologic formation 12, which can have an upper surface 13. The wellbore 10 can be drilled before formation evaluation tools are lowered into the borehole. The system 1 can include a rig 20 directly on an earth surface 13 and a downhole tool 5 can be conveyed into and out of the wellbore 10 via a conveyance 16. As described above with respect to FIG. 1B, the conveyance can be any suitable means of lowering a tool 5 downhole. A measurement tool 14 and a core sample collection tool 15 can be coupled via a joint 7 be positioned in a vertically stacked formation. The measurement tool 14 can be used to analyze the formation 12 within the wellbore 10, additionally the measurement tool 14 can notate the location within the wellbore where samples are collected via the core sample collection tool 15. Core samples and other formation samples obtained via core sample collection tool 15 can be received uphole at location 15A and provided for 3D image analysis.

In at least one example, the conveyance 16 can include conductors which can provide power and can be used to send control signals and data between the tools and an electronic control system 24. The electronic control system can include a control processor 24A operatively connected with the tool string 5. Logging tool and sample collection operations forming parts of the methods and systems disclosed herein can be embodied in a computer program that runs in the processor 24A. In operation, the program can be coupled to receive data, for example, from the downhole tools, via conveyance 16, and to transmit control signals to operative elements of the tool string 5. The computer program may be stored on a computer usable storage medium 24B (e.g. a hard disk) associated with the processor 24A, or may be stored on an external computer usable storage medium 26 or other recorder and electronically coupled to processor 24A for use as needed. The storage medium 26 may be any one or more of presently known storage media, such as a magnetic disk fitting into a disk drive, or an optically readable CD-ROM, or a readable device of any other kind, including a remote storage device coupled over a switched telecommunication link, or future storage media suitable for the purposes and objectives described herein. For example, the logging data stored at the storage medium 24B or external storage medium 26 can be transferred to one or more computers 27 having program instructions for carrying out further analysis of the logging data, 3D image analysis, and/or subsequent integrated formation property modeling as described herein. The control system 24, the external storage medium 26, and computer 27 can be connected to each other for communications (e.g., data transfer, etc.), via any of hardwire, radio frequency communications, telecommunications, internet connection, or other communication means. Further, the data and other logging related information collected at the control system 24 and/or storage medium 26 may be visually displayed on a monitor, CRT, log chart, or other visual means of display (not shown) at the site and/or offsite. The tool data and any initial interpretation information thereon can be communicated, for example, via satellite or land lines (not shown) to an offsite or remote location for further analysis relevant to logging information or formation characterization, including other interpretation software in combination with 3D image data obtained from samples collected in the same well interval of the well bore.

Geological formation samples 17, such as core samples or other types of formation samples removed from the formation 12 using core sample retrieval tool 15 can be transported to a CT or scanning electron microscope (SEM) scanner 19. The CT scanner or SEM scanner can use x-rays for analysis of internal structure of the samples, for generation of three dimensional (3D) images 21 of the geologic formation samples retrieved from the formation. The images so generated can be presented in numerical form and their content will be further explained below. After scanning, the samples can be saved for further analysis or may be discarded. In general, the instrument used to scan the geologic formation samples 17, or other types of retrieved samples from the formation (e.g., core samples, percussion samples, cuttings, etc.), can be selected based on how small are the pores in the rock and how much resolution is needed to produce a usable image. In the present example, the 3D image output (images) 21 generated by the CT scanner 19 can be transferred to a computer 27 having program instructions for carrying out the indicated geologic formation analysis to provide formation modeling output/results 29, described in greater detail below.

Modifications, additions, or omissions may be made to FIGS. 1A-1C without departing from the spirit and scope of the present disclosure. For example, FIGS. 1A-1C depict components of the wellbore operating environments in a particular configuration. However, any suitable configuration of components may be used. Furthermore, fewer components or additional components beyond those illustrated may be included in the wellbore operating environment without departing from the spirit and scope of the present disclosure. It should be noted that while FIGS. 1A-1C generally depict a land-based operation, those skilled in the art would readily recognize that the principles described herein are equally applicable to operations that employ floating or sea-based platforms and rigs or sub-sea, without departing from the scope of the disclosure. Also, even though FIGS. 1A-1C depict a vertical wellbore, the present disclosure is equally well-suited for use in wellbores having other orientations, including horizontal wellbores, slanted wellbores, multilateral wellbores or the like.

The methods described herein can use machine learning methods in order to provide a more accurate and in-depth analysis of downhole rock formations. For example, the present disclosure relates to a method for removing geologic formation samples from various locations throughout the length of a wellbore. The physical location of each geologic formation sample can be noted and recorded such that the data obtained from an analysis of the sample is correlated to a specific location within the wellbore.

Figure 2A:
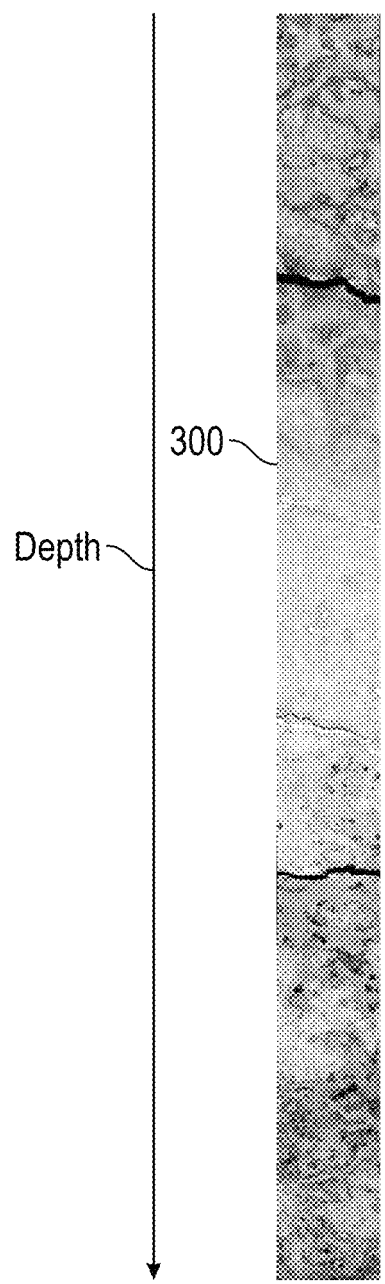
FIG. 2A illustrates an example image of a geologic formation sample taken from a wellbore environment.

The geologic formation sample can then be scanned using an x-ray, a CT scanner, an image sensor, or the like to provide an image of the geologic formation sample that can then be further analyzed to determine the appropriate rock classification for that location. FIG. 2A is an illustration of an image 300 of a geologic formation sample taken, for example, by a CT device. In at least one example, the image can be a CT scan of a core sample obtained from a wellbore. In an alternative example, the image can be an image of any geologic sample for which a classification is desired. In at least one example, as the image is created, data relating to the location of the geologic formation within a wellbore or geologic formation is also cataloged. Therefore, after the detailed analysis is performed the classified geologic formation can be traced to a specific location within the geologic formation.

The use of CT herein is only one exemplary imaging technique, as any imaging technique maybe used including any x-ray imaging, magnetic resonance imaging (MRI), scanning electron microscopy (SEM), electrical imaging, resistivity, optical imaging, and acoustical imaging. Imaging as disclosed herein may include a two-dimensional imaging (such as white-lite, UV-light, X-Ray projection, or thin section photography and the like), a three-dimensional imaging (such as a computerized tomography (CT), scanning electron microscopy (SEM)), MRI, or any other method or device suitable for evaluating 2-D or 3-D distribution of a property within the sample.

Image Segmentation and Textual Assignment

Next, the image can be initially evaluated based on a visual inspection of the changes in rock texture. In at least one example, once such a geologic formation sample image is taken (as shown in FIG. 2A), a visual inspection can provide an initial texture segmentation or analysis indicating or classifying any number of potentially different rock formation types within the sample size. The particular textures may be identified by an expert, and may have some subjectivity. Non-limiting examples of formation sample types which may include, but are not limited to, rock types, rock textures, facies, and/or any rock properties which may affect the hydrocarbon extraction process. In at least one example, the image for classification can be a cross-sectional image of the geologic formation sample. Each section of the geologic formation sample can then be classified by visional inspection of the image.

Figure 2B:
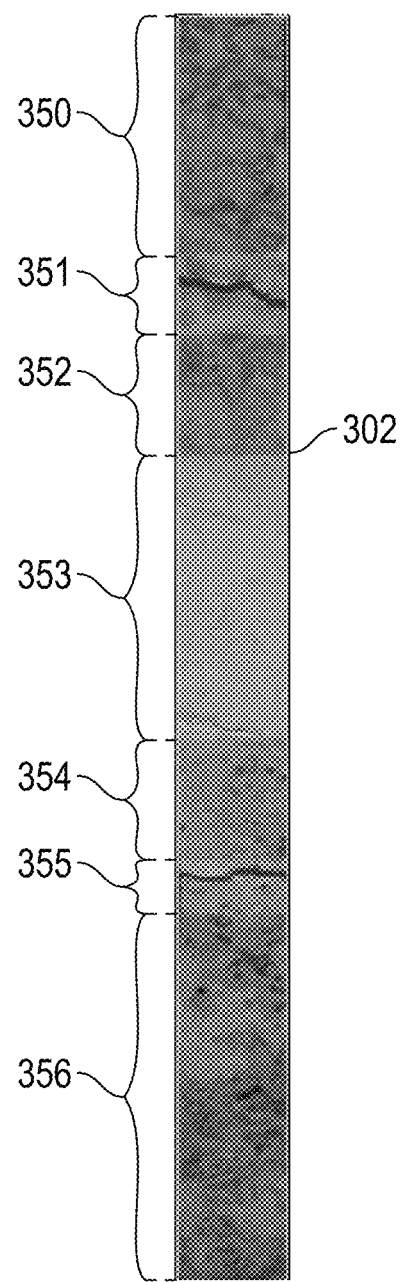
FIG. 2B illustrates the example image shown in FIG. 2A divided into multiple different formation types or textures.

As shown in FIG. 2B, the image 300 can be divided or partitioned into multiple different formation types or textures as shown in texture segment image 302. In the present example, the initial analysis has provided three different rock textures/formations indicated by different colors overlaid onto the image. The blue sections 350, 352, 354, 356 represent a first rock texture/formation, the red section 353 represents a second variation of rock texture/formation, and the green sections 351 and 352 represent a third variation of the rock texture/formation of the core sample. While the present example illustrates three variations in texture/formation, it should be readily recognized by those having skill in the art that any number of various textures or formations could be indicated based on the specific sample undergoing evaluation. Additionally, while FIG. 2B illustrates the difference in rock textures in colors, it should be readily recognized by those having skill in the art that a gray level co-occurrence matrix (GLCM), or any other suitable method or characteristics (e.g., patterns, identifiers, etc.) could be used. In at least one embodiment, a neural network can be calibrated such that the geologic formation analytics system can perform the initial analysis of the image.

Image Patches and Example Neural Network

The image can then be cropped or otherwise partitioned or divided into small patches. These small patches may be a pixel, one or more pixels, and/or an superpixel, an area of a plurality of pixels, or segments of the image. The cropping may be done manually or may be automatic via computer program. For example, in some cases, the image can be partitioned/segmented into patches using computer-based image processing techniques (e.g., image segmentation, etc.). The cropping may be sufficiently sized to capture a particular texture type or area of the image. The cropping may also be done in an organized stepwise fashion, such as moving left to right horizontally or may be done vertically.

These small patches may be a single pixel, one or more pixels, and/or a superpixel, an area of a plurality of pixels, or segments of the image. The cropping may be done manually or may be automatic via computer program. The cropping may be sufficiently sized to capture a particular texture type or area of the image. The cropping may also be done in an organized stepwise fashion, such as moving left to right horizontally or may be done vertically.

The image and the initial texture segmentation data and/or patches can then be uploaded or otherwise provided to a geologic formation sample analytics system. For instance the uploaded data after being divided into small patches may be fed into a deep neural network which can be used to extract semantic representations of the rock formation textures. Various deep neural network methods can be used in accordance with the methods and systems described herein including, but not limited to, triplet loss, quadruplet learning, convolutional neural network, few shot learning, one shot learning, and any other suitable machine learning methods or programs. While deep learning networks are disclosed herein for semantic extraction of textures, any system or semantic extraction processor may be employed for this purposed.

Figure 3:
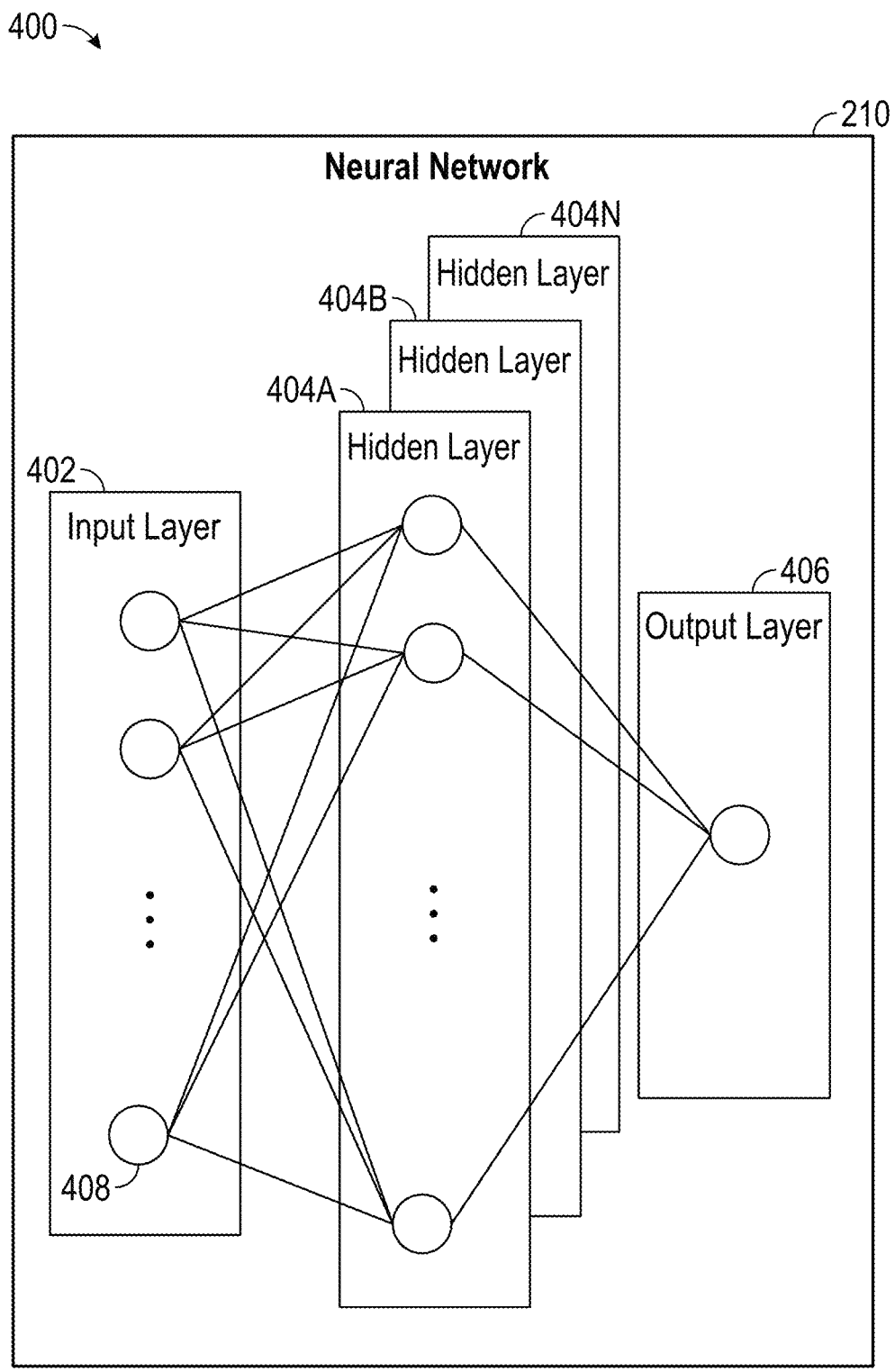
FIG. 3 illustrates an example configuration of a neural network.

FIG. 3 illustrates an example configuration 400 of neural network 210, which is a convolutional neural network. In this example, the neural network 210 includes an input layer 402 which includes input data, such as collected image data, images (e.g., image 300 of FIG. 2A), or image patches. In one illustrative example, the input layer 402 can include data representing the pixels of one or more input images.

The neural network 210 includes hidden layers 404A through 404N (collectively "404" hereinafter). The hidden layers 404 can include n number of hidden layers and network architectures/complexities, where n is an integer greater than or equal to one. The number of hidden layers can be made to include as many layers as needed for the given application. The neural network 210 further includes an output layer 406 that provides an output resulting from the processing performed by the hidden layers 404. In one illustrative example, the output layer 406 can provide a classification and/or localization of one or more regions, patches, and/or features in an input image (e.g., image 300 of FIG. 2A). The classification can include a class identifying the properties of the geologic formation (e.g., texture, grain, porosity, rock type, or any other geologic formation property) depicted/captured in the input image and the localization can include a bounding box indicating the location of the region, patch, and/or features.

The neural network 210 can be a multi-layer deep learning network of interconnected nodes. Each node can represent a piece of information. Information associated with the nodes is shared among the different layers and each layer retains information as information is processed. In some cases, the neural network 210 can include a feed-forward network, in which case there are no feedback connections where outputs of the network are fed back into itself. In some cases, the neural network 210 can include a recurrent neural network, which can have loops that allow information to be carried across nodes while reading in input.

Information can be exchanged between nodes through node-to-node interconnections between the various layers. Nodes of the input layer 402 can activate a set of nodes in the first hidden layer 404A. For example, as shown, each of the input nodes of the input layer 402 is connected to each of the nodes of the first hidden layer 404A. The nodes of the hidden layer 404A can transform the information of each input node by applying activation functions to the information. The information derived from the transformation can then be passed to and can activate the nodes of the next hidden layer (e.g., 404B), which can perform their own designated functions. Example functions include convolutional, up-sampling, data transformation, pooling, and/or any other suitable functions. The output of the hidden layer (e.g., 404B) can then activate nodes of the next hidden layer (e.g., 404N), and so on. The output of the last hidden layer can activate one or more nodes of the output layer 406, at which point an output is provided. In some cases, while nodes (e.g., node 408) in the neural network 210 are shown as having multiple output lines, a node has a single output and all lines shown as being output from a node represent the same output value.

In some cases, each node or interconnection between nodes can have a weight that is a set of parameters derived from training the neural network 210. For example, an interconnection between nodes can represent a piece of information learned about the interconnected nodes. The interconnection can have a numeric weight that can be tuned (e.g., based on a training dataset), allowing the neural network 210 to be adaptive to inputs and able to learn as more data is processed.

The neural network 210 can be pre-trained to process the features from the data in the input layer 402 using the different hidden layers 404 in order to provide the output through the output layer 406. In at least one example in which the neural network 210 is used to identify features in images, the neural network 210 can be trained using training data that includes both images and labels. For instance, training images can be input into the neural network 210, with each training image having a label indicating the classes of the one or more features in each image (basically, indicating to the network what features are included and identified in the image).

In some cases, the neural network 210 can adjust the weights of the nodes using a training process called backpropagation. Backpropagation can include a forward pass, a loss function, a backward pass, and a weight update. The forward pass, loss function, backward pass, and parameter update is performed for one training iteration. The process can be repeated for a certain number of iterations for each set of training images until the neural network 210 is trained enough so that the weights of the layers are accurately tuned.

For the example of identifying features in images, the forward pass can include passing a training image through the neural network 210. The weights can be initially randomized before the neural network 210 is trained. The image can include, for example, an array of numbers representing the pixels of the image. Each number in the array can include a value from 0 to 255 describing the pixel intensity at that position in the array. In one example, the array can include a 28×28×3 array of numbers with 28 rows and 28 columns of pixels and 3 color components (such as red, green, and blue, or luma and two chroma components, or the like).

For a first training iteration for the neural network 210, the output can include values that do not give preference to any particular class due to the weights being randomly selected at initialization. For example, if the output is a vector with probabilities that a feature representation includes different classes, the probability value for each of the different classes may be equal or at least very similar (e.g., for ten possible classes, each class may have a probability value of 0.1). With the initial weights, the neural network 210 is unable to determine low level features and thus cannot make an accurate determination of what the classification of the object might be. A loss function can be used to analyze errors in the output. Any suitable loss function definition can be used.

The loss (or error) can be high for the first training images since the actual values will be different than the predicted output. The goal of training is to minimize the amount of loss so that the predicted output is the same as the training label. The neural network 210 can perform a backward pass by determining which inputs (weights) most contributed to the loss of the network, and can adjust the weights so that the loss decreases and is eventually minimized.

A derivative of the loss with respect to the weights can be computed to determine the weights that contributed most to the loss of the network. After the derivative is computed, a weight update can be performed by updating the weights of the filters. For example, the weights can be updated so that they change in the opposite direction of the gradient. A learning rate can be set to any suitable value, with a high learning rate including larger weight updates and a lower value indicating smaller weight updates.

While the neural network 210 is exemplified as a convolutional neural network, it may alternatively be or can include any suitable deep network. One example includes a convolutional neural network (CNN), which includes an input layer and an output layer, with multiple hidden layers between the input and out layers. The hidden layers of a CNN include a series of convolutional, nonlinear, pooling (for downsampling), and fully connected layers. In other examples, the neural network may represent any other deep network other than a CNN, such as an autoencoder, a deep belief nets (DBNs), a Recurrent Neural Networks (RNNs), etc.

Figure 4:
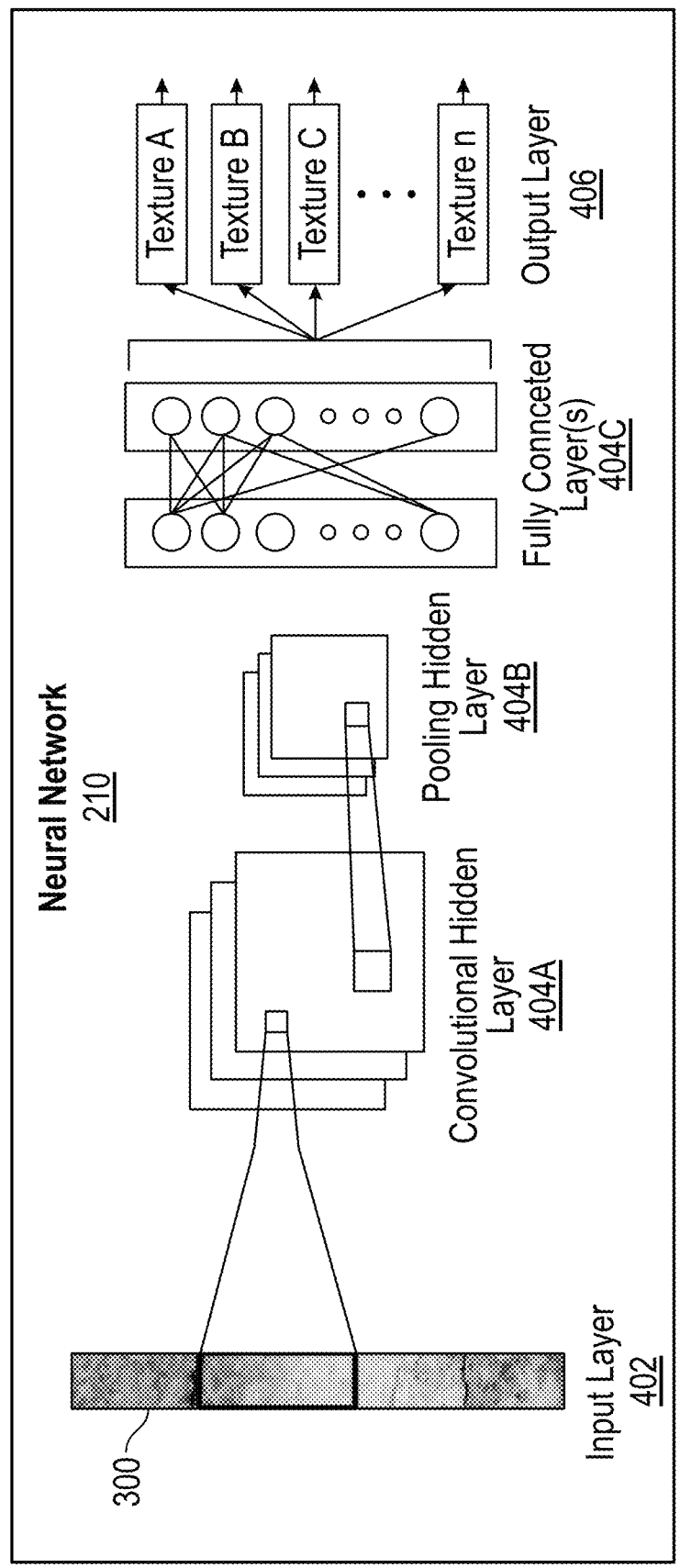
FIG. 4 illustrates an example use of a neural network for performing deep learning.

FIG. 4 illustrates an example use of neural network 210 to perform deep learning. In this example, the neural network 210 includes an input layer 402, a convolutional hidden layer 404A, a pooling hidden layer 404B, fully connected layers 404C, and output layer 406. The neural network 210 can identify specific rock properties (e.g., grain, shale, porosity, rock type, etc.) in an image 300 geologic core sample. First, each pixel in the image 300 is considered as a neuron that has learnable weights and biases. Each neuron receives some inputs, performs a dot product and optionally follows it with a non-linearity function. The neural network 210 can also encode certain properties into the architecture by expressing a single differentiable score function from the raw image pixels on one end to class scores at the other to extract specific rock properties from the target image. After identifying features in the image as specific rock properties, the neural network 210 can generate a mean score (or z-score) of each feature and take the average of the scores within the user-defined buffer.

In some examples, the input layer 404A includes data representing an image (e.g., 300 of FIG. 2A). For example, the data can include an array of numbers representing the pixels of the image, with each number in the array including a value from 0 to 255 describing the pixel intensity at that position in the array. The image can be passed through the convolutional hidden layer 404A, an optional non-linear activation layer, a pooling hidden layer 404B, and fully connected hidden layers 406 to get an output at the output layer 406. The outputs can indicate a continuous number to describe the texture or rock classification.

The convolutional hidden layer 404A can analyze the image data of the input layer 402A. Each node of the convolutional hidden layer 404A can be connected to a region of nodes (pixels) of the input image. The convolutional hidden layer 404A can be considered as one or more filters (each filter corresponding to a different activation or feature map), with each convolutional iteration of a filter being a node or neuron of the convolutional hidden layer 404A. Each connection between a node and a receptive field (region of nodes (pixels)) for that node learns a weight and, in some cases, an overall bias such that each node learns to analyze its particular local receptive field in the input image.

The convolutional nature of the convolutional hidden layer 404A is due to each node of the convolutional layer being applied to its corresponding receptive field. For example, a filter of the convolutional hidden layer 404A can begin in the top-left corner of the input image array and can convolve around the input image. As noted above, each convolutional iteration of the filter can be considered a node or neuron of the convolutional hidden layer 404A. At each convolutional iteration, the values of the filter are multiplied with a corresponding number of the original pixel values of the image. The multiplications from each convolutional iteration can be summed together to obtain a total sum for that iteration or node. The process is next continued at a next location in the input image according to the receptive field of a next node in the convolutional hidden layer 404A. Processing the filter at each unique location of the input volume produces a number representing the filter results for that location, resulting in a total sum value being determined for each node of the convolutional hidden layer 404A.

The mapping from the input layer 402 to the convolutional hidden layer 404A can be referred to as an activation map (or feature map). The activation map includes a value for each node representing the filter results at each locations of the input volume. The activation map can include an array that includes the various total sum values resulting from each iteration of the filter on the input volume. The convolutional hidden layer 404A can include several activation maps in order to identify multiple features in an image. The example shown in FIG. 4 includes three activation maps. Using three activation maps, the convolutional hidden layer 404A can detect three different kinds of features, with each feature being detectable across the entire image.

In some examples, a non-linear hidden layer can be applied after the convolutional hidden layer 404A. The non-linear layer can be used to introduce non-linearity to a system that has been computing linear operations.

The pooling hidden layer 404B can be applied after the convolutional hidden layer 404A (and after the non-linear hidden layer when used). The pooling hidden layer 404B is used to simplify the information in the output from the convolutional hidden layer 404A. For example, the pooling hidden layer 404B can take each activation map output, from the convolutional hidden layer 404A and generate a condensed activation map (or feature map) using a pooling function. Max-pooling is one example of a function performed by a pooling hidden layer. Other forms of pooling functions can be used by the pooling hidden layer 404B, such as average pooling or other suitable pooling functions. A pooling function (e.g., a max-pooling filter) is applied to each activation map included in the convolutional hidden layer 404A. In the example shown in FIG. 4, three pooling filters are used for the three activation maps in the convolutional hidden layer 404A.

The pooling function (e.g., max-pooling) can determine whether a given feature is found anywhere in a region of the image, and discard the exact positional information. In some cases, this can be done without affecting results of the feature detection because, once a feature has been found, the exact location of the feature is not as important as its approximate location relative to other features. Max-pooling (as well as other pooling methods) offer the benefit that there are fewer pooled features, thus reducing the number of parameters needed in later layers.

The fully connected layer 404C can connect every node from the pooling hidden layer 404B to every output node in the output layer 406. The fully connected layer 404C can obtain the output of the previous pooling layer 404B (which should represent the activation maps of high-level features) and determine the features that correlate to a particular class. For example, the fully connected layer 404C layer can determine the high-level features that most strongly correlate to a particular class, and can include weights (nodes) for the high-level features. A product can be computed between the weights of the fully connected layer 404C and the pooling hidden layer 404B to obtain probabilities for the different classes.

In some examples, the output from the output layer 405 can include an n-dimensional vector, where n can include the number of classes that the program has to choose from when classifying the object in the image. Other example outputs can also be provided. Each number in the n-dimensional vector can represent the probability the feature is of a certain class.

As illustrated in FIG. 4, the output layer 406 may output a plurality of textures, such as texture A, texture B, or texture C, and which may correspond to the textures in image 300 of FIG. 2A, or may a be a larger number n of textures. These textures can be subject to a dimension reduction technique as further described below.

Figure 5:
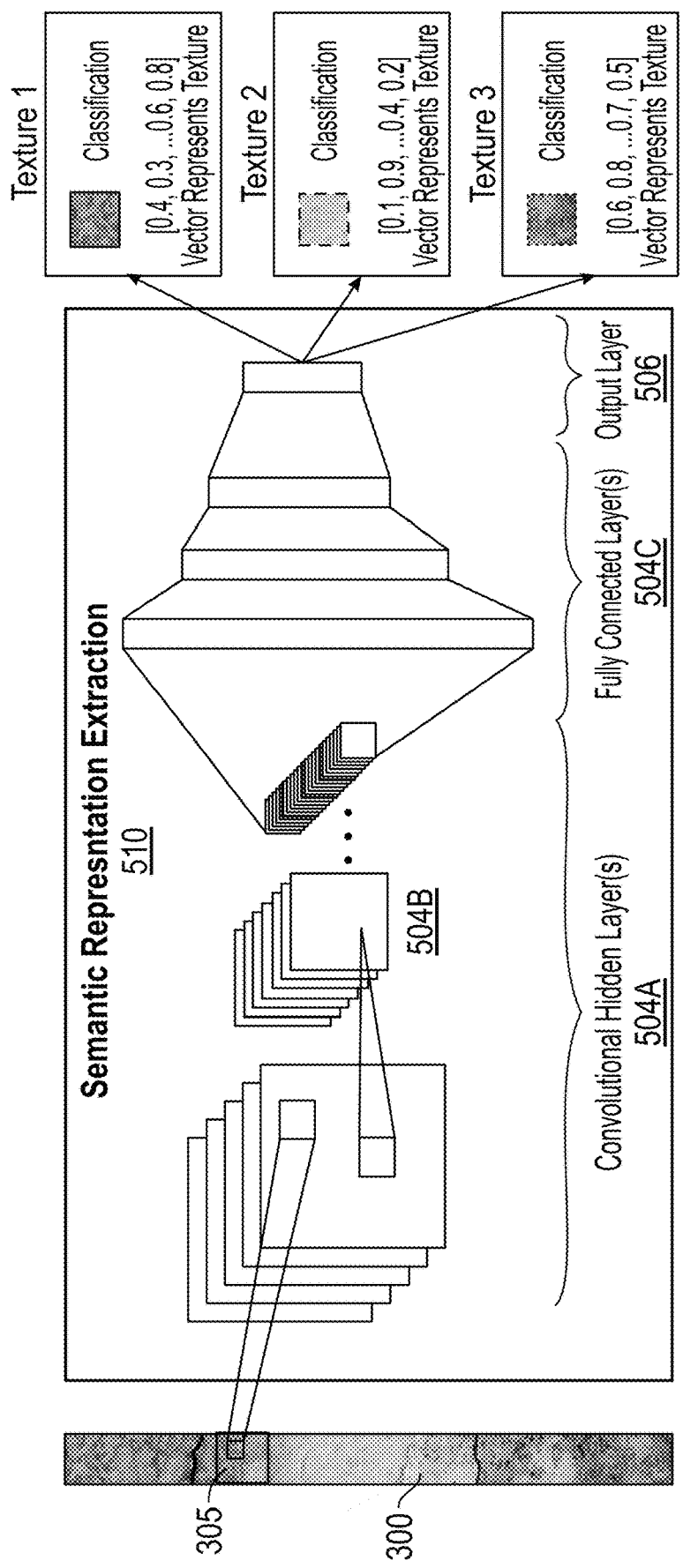
FIG. 5 illustrates another example use of a neural network to extract semantic representations of textures from an example image of a geologic formation sample.

FIG. 5 illustrates an additional example use of a neural network 510 to extract semantic representation of textures. As shown on the left side of FIG. 5, a section of the it 300 is cropped (e.g., partitioned/segmented) into a cropped segment 305. This cropped segment 305 can be a patch or region in the image 300 containing one or more pixels or superpixels, for example. The cropped segment 305 is fed into the convolutional hidden layers 504A, which may include additional pooling layers 504B. The pooling hidden layer 504B is used to simplify the information in the output from the convolutional hidden layer 504A similarly as described with respect to pooling hidden layer 304B of FIG. 4. The fully connected layers 504C can obtain the output of the previous pooling layer and determine the features that correlate to a particular class, in this case types of textures or types of components of textures. A product can be computed between the weights of the fully connected layer 504C and the pooling hidden layer 504B to obtain probabilities for the different classes.

The fully connected layer 504C can connect every node from the pooling hidden layer 504B to every output node in the output layer 406. As shown the output layer can include particular texture classifications. Shown as outputs are three semantic representations of textures extracted by the neural network 510, namely texture 1, texture 2 and texture 3. Although three textures are shown, there may be any plurality of textures extracted from the image 300. These can represent different facies, rock types of the geologic formation, such as texture, grain, porosity, rock type, or any other geologic formation property.

Subsequent extraction, a dimension reduction is performed on the extracted semantic representations of textures to reduce a din of representation into a smaller number, such as 2 or 3. The dimension reduction technique may include linear and non-linear principal component analysis or Student T stochastic neighbor embedding. The dimension reduction can be performed on the data extracted from the deep learning method to reduce the dimension of representation/features/semantic representation from high dimension, for example, 128 or 1000 dimension, into smaller numbers, for example, 2 or 3.

The smaller number can represent a position or vector in 2D or 3D space. A 2D or 3D graph may be generated based on the vector produced by the dimension reduction so as to depict the textures at the respective vector for viewing by a user. As shown in FIG. 5, each of the textures may be represented by a vector, Texture 1, showing vector (0.4, 0.3, . . . 0.6, 0.8), Texture 2, showing vector (0.1, 0.9, . . . 0.4, 0.2), Texture 3 showing vector (0.6, 0.8, . . . 0.7, 0.5), each of the vectors corresponding, in this case to an area in 2D or 3D space. Such vectors are merely exemplary and the output may provide different vectors and may provide more than three textures such as any plurality or a number textures with corresponding vectors.

Textures larger than a specific point or pixel may include vector coordinates for an area in the 2D or 3D space. The dimension reduction technique may include linear and non-linear principal component analysis or Student T stochastic neighbor embedding. The dimension reduction can then be performed on the data extracted from the deep learning method (at least one example is shown as a high dimension vector in 404C, as shown in FIG. 6) to reduce the dimension of representation/features/semantic representation from high dimension (for example, 128 or 1000 dimension) into smaller numbers (for example, 2 or 3).

Figure 6:
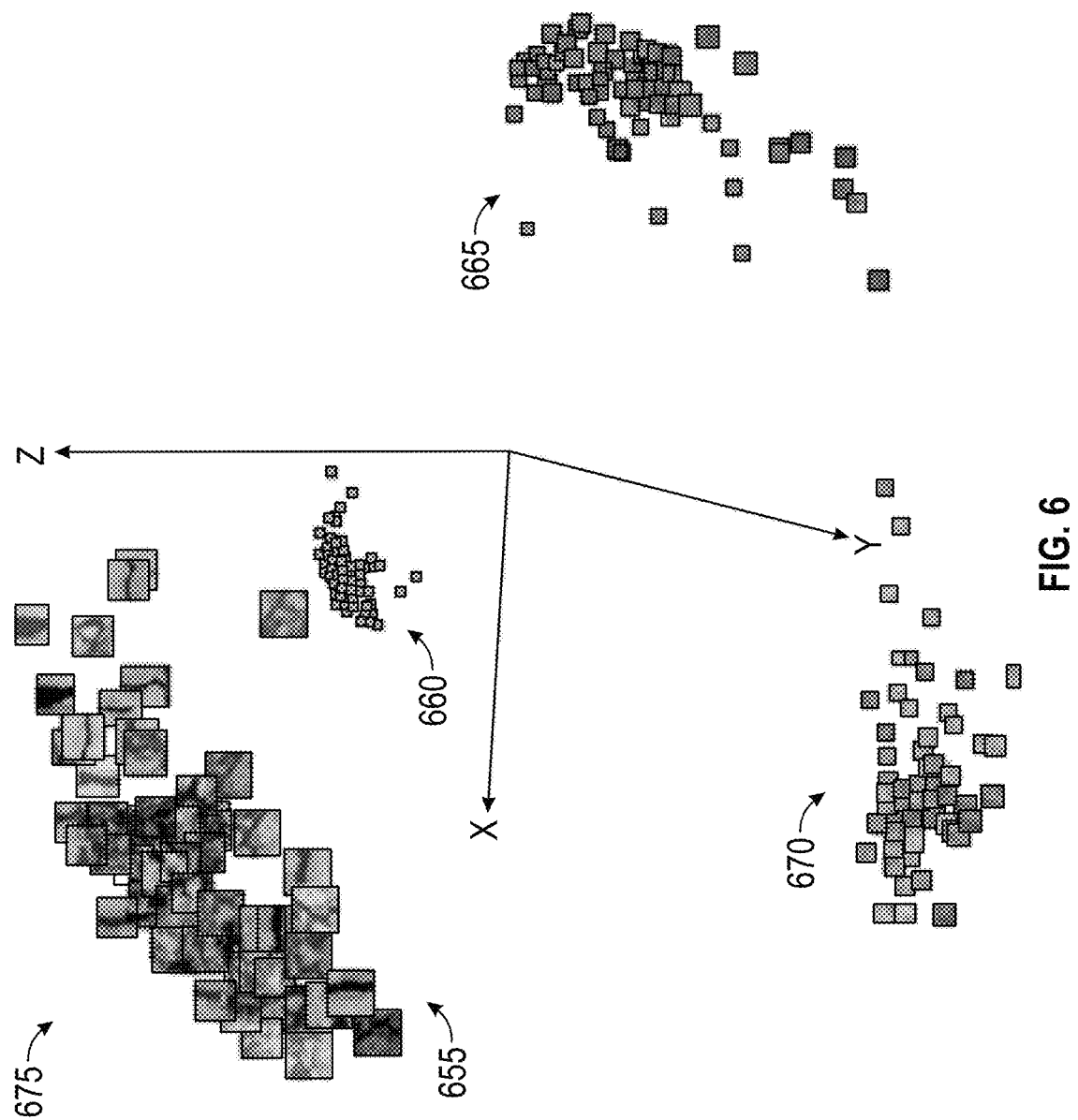
FIG. 6 illustrates example semantic representations of textures extracted from an image of a geologic formation sample which have a reduced dimension of representation plotted in space and provided in a graph.

FIG. 6 illustrates extracted semantic representations of textures which have a reduced dimension of representation plotted in 3D space as provided in graph 675. The graph 675 is provided with X, Y, and Z axes to illustrate three dimensions. Shown within particular locations within the graph 675 are four grouping of textures, texture group 655, texture group 660, texture group 665, texture group 670. Each of these texture groupings are made up of a plurality of individual vectors, represented by the plurality of squares within each of the groupings. Each of the plurality of squares corresponds to the extracted semantic representation of a texture and the extracted texture's associated vector, such as those output by output layer 506 of FIG. 5. Accordingly, once a texture is extracted by the neural network, and the associated vector obtained by the dimension reduction technique, the texture can be illustrated by plotting in a graph such as graph 675 for viewing by a user. The squares will each have a position in the graph 675 corresponding to the vector shown in output layer 506.

The graph 675 is a 3D graph, however, the textures may also be represented in 2D space. Whether a 2D or 3D graph is employed may depend on the complexity, the number of types, and closeness of textures in the image of the formation. Additionally, the vectors provided by output layer 506 in FIG. 5 are exemplary and so do not necessarily correspond to those in graph 675 of FIG. 6, however, in practice, the textures and associated vector outputs can be plotted in a 3D or 2D graph similar to exemplary graph 675.

Each of the texture groups 655, 660, 665, and 670 may each represent different classification of textures, such as different types of rock, or other classification. Each may be assigned a particular color such as the red, blue and green provided in FIG. 2B, or additional colors. Each of the texture groups 655, 660, 665, and 670 are represented in the graph 675 in different portions of the graph, with the distance between each of the groupings representing differences between the textures, where texture groups closer together may be more similar and textures further apart may be less similar (or more different). Furthermore, there are degrees of difference within each of the texture groups of FIG. 6 as well. For instance, each of the squares in the texture groups are similar in that they all are represented within a grouping. However, some squares (textures) closer together within a texture group may be more similar, and those squares further apart within a texture group may be less similar (or more different). Accordingly, the differences in textures are provided in a continuous manner.

Accordingly, by this method clean sandstone at a depth of 10,000 feet may be differentiated from clean sandstone at 12,000 or 15,000, even if each of these areas may be considered "clean sandstone". For example, in analyzing a geologic formation sample according to the present disclosure if texture A at 10,000 feet is described as vector (0.1.34, 0.056, 0.876), texture A at 12,000 feet is described as vector (0.156, 0.078, 0.932), and texture A at 15,000 feet is described by vector (0.245, 0.093, 0.548) it can be determined that texture A at 10,000 and 12,000 are more similar than texture A at 10,000 and 15,000. Accordingly, the methods described herein provide for an analysis of texture in a continuous manner. Specifically, while commonly used methods allow for classification of specific types of rock (e.g., sand, shale, sandstone, etc.) the present methods allow for further differentiations to be made within each rock type.

Formation of Texture Curves

After carrying out the neural network convolution to obtain semantic representations of textures, and determining the reduced dimension, the location of the patches which were subject to the neural network are then registered back to the original formation samples. This way the textures and vectors obtained can be traced back to their location in the original images and the obtained formation sample.

The patches which are registered to the original image are then subject to analysis to find a meaningful representation of the formation sample at the horizontal level. For instance, the texture of the image may differ across a horizontal segment of the image 300 or 302 (going from left to right or left to right of the image). However, the horizontal segment still requires to be assigned a texture classification and vector. Accordingly, this analysis can be a statistical method performed on the patches registered to the original formation sample image, such as image 300, to determine a statistically meaningful representation of the patch at the horizontal level. Although horizontal, this may be carried out in any direction including vertical. This analysis is repeated throughout the entire image, such as image 300, until the entire desired area of the image has been analyzed.

For instance, the image 302 of FIG. 2B includes segments of textures represented in blue, red and green as discussed above with respect to FIG. 2B. Notably, each of the texture segments are the same, i.e., the same color or assigned texture, across a horizontal level.

Figure 7B:
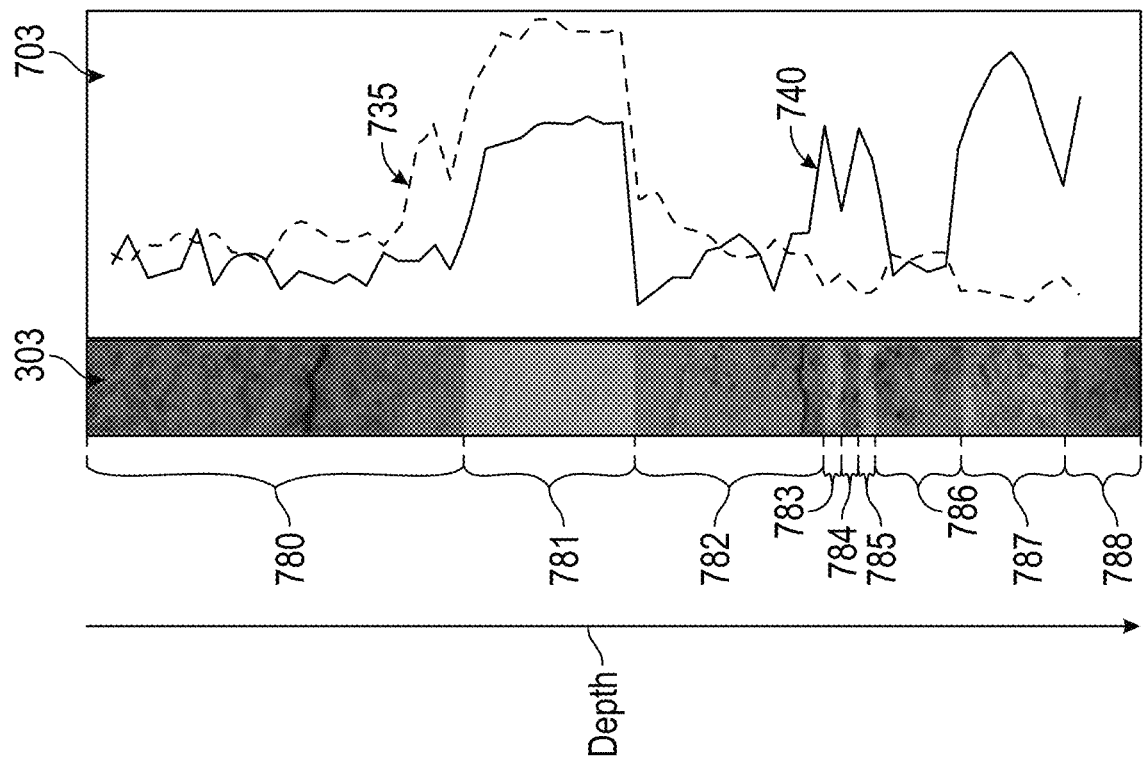
FIG. 7B illustrates the image and set of curves shown in FIG. 7A where the set of curves have a dimension of representation of two.
Figure 7A:
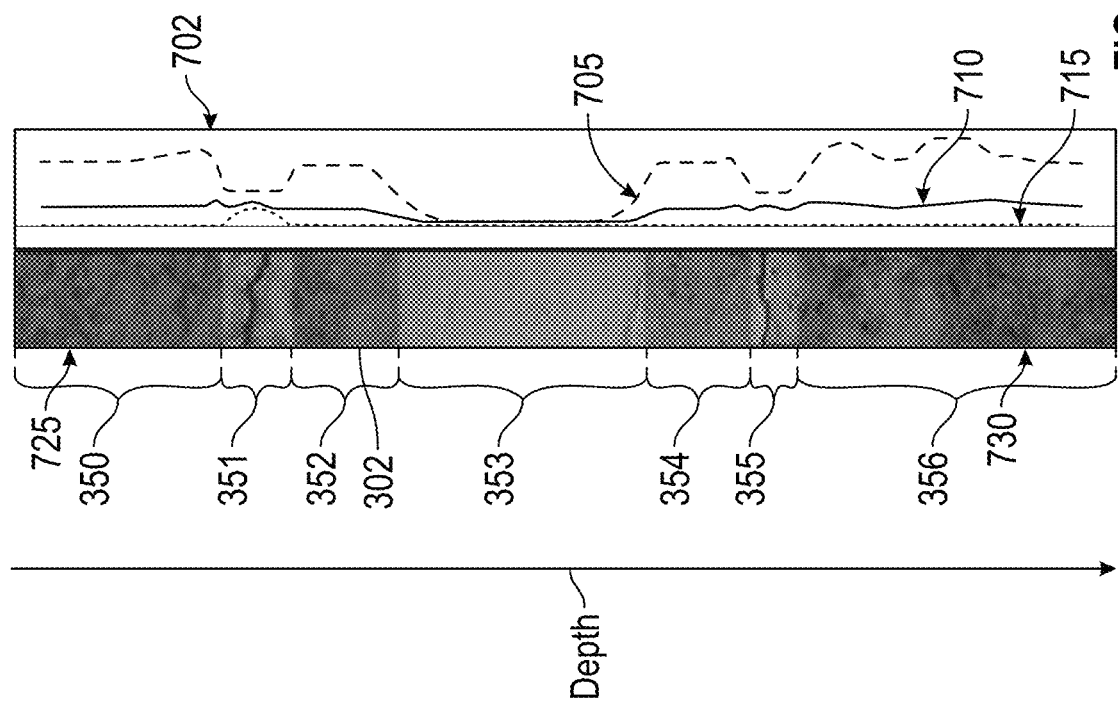
FIG. 7A illustrates an example image having multiple segments depicting different formation types or textures and a set of curves representing textures extracted by a neural network and depicted adjacent to the image.

FIG. 7A illustrates the image 302 along with curves representing the textures convolved from the neural network. The texture curves 702 are charted based on the vectors obtained from output layers of the neural network, such as 506 in FIG. 5, and shown in the graph 575 of FIG. 6. These the vectors plotted as texture curves 702, and may be provided adjacent the image 302 as shown in FIG. 7. The texture curves 702 correspond to the same depth of the formation represented in the image 302 so that the textures perceived in the image 302 correspond to the position of the texture curves 702. The texture curves 702 have increasing vector value going from left to right, for example the far left edge of the curves may be 0, and the far right may be 1, such that the texture curves 702 have a continuous value between 0 and 1. Other scaling values may be employed as well. Each of the lines corresponds to an axis, such as an X, Y, Z, or each of the scalar components of the associated vector, (x, y, z) in 3D, or in 2D space, each line corresponds to X, Y, or the scalar components of the associated vector (x, y) in 2D, respectively.

As shown in FIG. 7A, texture curves 702 includes three graph lines, namely, X-axis line 705, Y-axis line 710 and Z-axis line 715. The X-axis line 705 (which may be green for instance) can correspond to vector component x, such as from output layer 506 and the corresponding graph 675. The Y-axis line 710 (which may be red or brown for instance) can correspond to vector component y, such as from output layer 506 and the corresponding graph 675, the Z-axis line 715 (which may be blue for instance) can correspond to vector component z, such as from output layer 506 and the corresponding graph 675. Accordingly, by viewing the curves 702, a user can visualize the vector components and the corresponding differences in texture at the various depths/locations. This further facilitates a user viewing the difference between even similar textures. For instance, the top blue segment 350 differs from the bottom blue segment 356 in that for example line X-axis line 705 is further to the right in the bottom blue segment 356. This indicates that although the textures are both considered the same type of texture (for instance clean shale), they are actually different in some respects indicated by the X-axis line. In this manner, differences between groups and degrees of difference within groups can be determined by visualizing the curves 702. Other exemplary texture variations are again represented in color in FIG. 7A with the Hue sections 350, 352, 354, 356 representing a first rock texture/formation, the red section 353 representing a second variation of rock texture/formation, and the green sections 351 and 352 representing a third variation of the rock texture/formation of the core sample.

While FIG. 7A illustrates a curve of convolved textures reduced to dimension of representation of three, FIG. 7B, illustrates the same but with a dimension of representation of two. FIG. 7A illustrates an image 303 with texture segments, along with texture curves 703 representing the textures convolved from the neural network. Each of the lines of the texture curves 703 corresponds to an axis, such as an X or Y of a graph and/or each of the scalar components of the associated vector, (x, y) in 2D space. In this case the texture curves 703 include only two lines, for instance x-axis line 735 which may correspond to an x-axis of a 2D graph, or x component of a scalar vector, and y-axis line 740 which may correspond to an x-axis of a 2D graph, or y component of a scalar vector. The to curves 703 correspond to the same image depth as image 303, such that by viewing the texture curves 703, a user can visualize the vector components and the corresponding differences in texture along the image depth. Rock textures are illustrated in color as shown by segments including blue sections 780, 782, 784 786, 788, representing a first rock texture, red section 781 representing a second rock texture, and green sections 783, 785, and 787 representing a third rock texture variation.

Accordingly, the texture curves 702 and texture curves 703 of FIGS. 7A and 7B allow for a more detailed indication of the changes in texture/formation throughout the originally divided sections. For example, while the blue, red, and green sections provide different curves, the analysis has also allowed for the more subtle changes in the formation to be observed.

Furthermore, the texture curves can be evaluated along with other types of formation properties to reveal other aspects of the formation sample. Accordingly additional measurements of the formation or formation samples may be obtained and combined with the texture curves to provide greater understanding of the formation textures and/or classifications, which otherwise would not be known by reviewing the texture curves alone. For instance other properties may include for instance density, photo electric response data, etc., in order to provide a better understanding of the formation sample and/or downhole environment.

Method Embodiments

Figure 8:
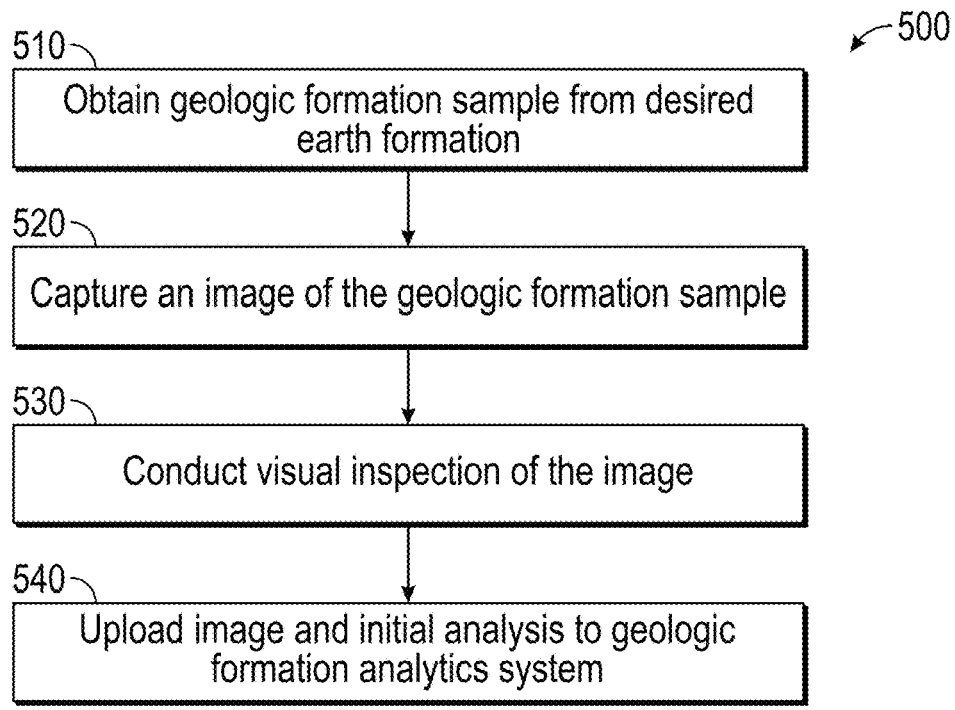
FIG. 8 is a flow chart illustrating a method for gathering geologic formation data.

A method 500 for obtaining data as described above is illustrated in FIG. 8. The method 500 can begin at block 510, where a geologic formation sample is obtained from a geologic formation of which further analysis is desired. As described in detail above, the geologic formation sample can be collected from within a wellbore or from any other geologic formation. In at least one example, the geologic formation sample is collected during the drilling process, as described with respect to FIG. 1A. Such samples can include, but are not limited to, a core sample and drill cuttings. In an alternative example, the geologic formation sample can be retrieved from a wellbore via a wireline tool, as described with respect to FIG. 1B. Specifically, a wireline tool can be lowered to an area of the wellbore for which further analysis is desired. The wireline tool can then retrieve a sample from the geologic formation adjacent the wellbore and return the sample to the surface for analysis.

At block 520 an image of the geologic formation sample is captured in order to allow for an initial analysis. In at least one example, the geologic formation sample is captured using an x-ray or a CT scanner. In other examples, the geologic formation sample can be captured using any other type of scanner, image sensor, or combination of scanners and/or image sensors. At block 530, a visual inspection of the image can be performed in order to provide an Initial categorization of the textures within the geologic sample. Finally, at block 540, the image and the initial analysis of the geologic formation can be uploaded to a geologic formation analytics system.

Figure 9:
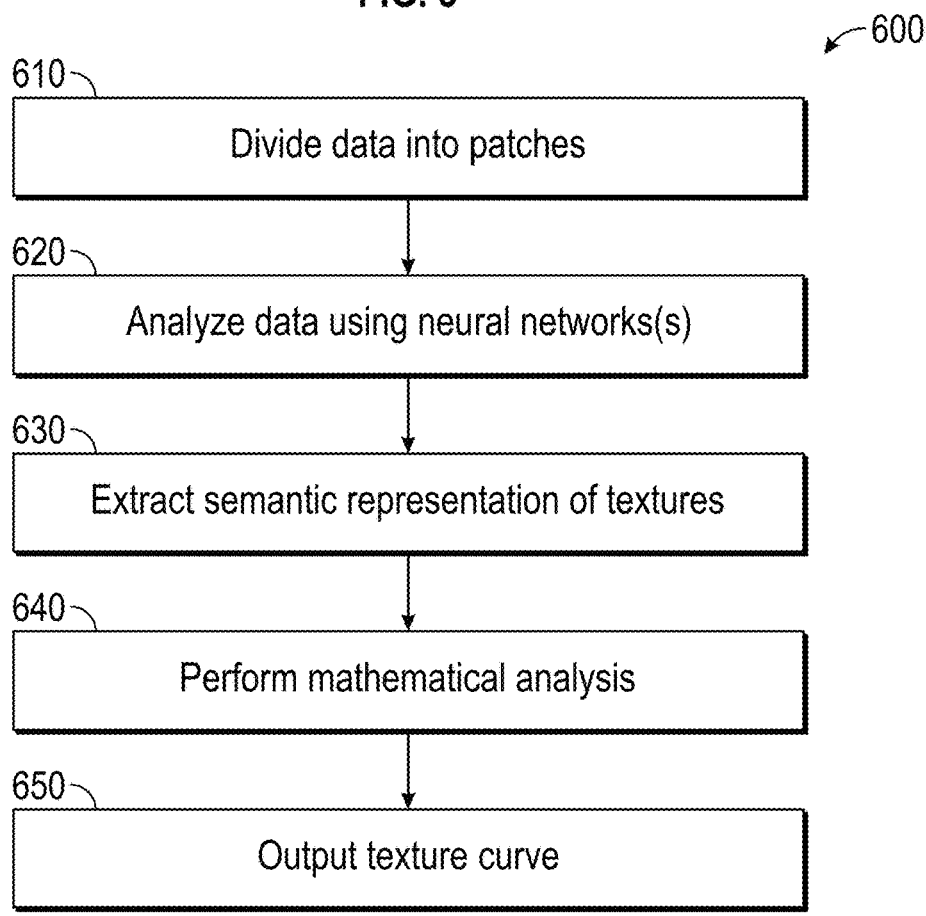
FIG. 9 is a flow chart illustrating an analysis of geologic information data in accordance with the methods disclosed herein.

A method 600 for detailed analysis of a geologic sample using a geologic formation analytics system is illustrated in FIG. 9. The method 600 can begin at block 610 where the data (e.g., image data from the captured sample/image) uploaded to the geologic formation analytics system is divided into smaller sections, or patches, for detailed evaluation. The division of the original data into smaller patches allows for the textures formations that were initially indicated as similar to be further evaluated in order to determine if a small change in texture occurred in the larger geologic formation.

At block 620, the patches can be analyzed using a neural network. The neural network analysis can be conducted in accordance with the above description. At block 630, a semantic representation of textures is extracted from the data, using the neural network. For example a numerical representation for each change in texture can be extracted by the neural network. As stated above, each section of the image can be cataloged with the original location of the geologic sample. In at least one example, the numerical data can be correlated to a physical location, such as a depth within a wellbore. At block 640, a statistical method, as described above in [0024], can be performed on each of the patches. The above steps can be repeated as necessary for each patch within the original image.

Finally, the textures of the geologic formations can be displayed. At block 650, a curve is created using a set of numerical values representing different textures within the geologic formation and location data from the initial sample. For example, FIG. 6C illustrates a curve showing changes in texture corresponding to depth within a wellbore.

The methods described herein provide an analysis of texture in a continuous manner. Specifically, while commonly used methods allow for classification of specific types of rock (e.g., sand, shale, sandstone, etc.) the present methods allow for further differentiations to be made within each rock type.

Figure 10:
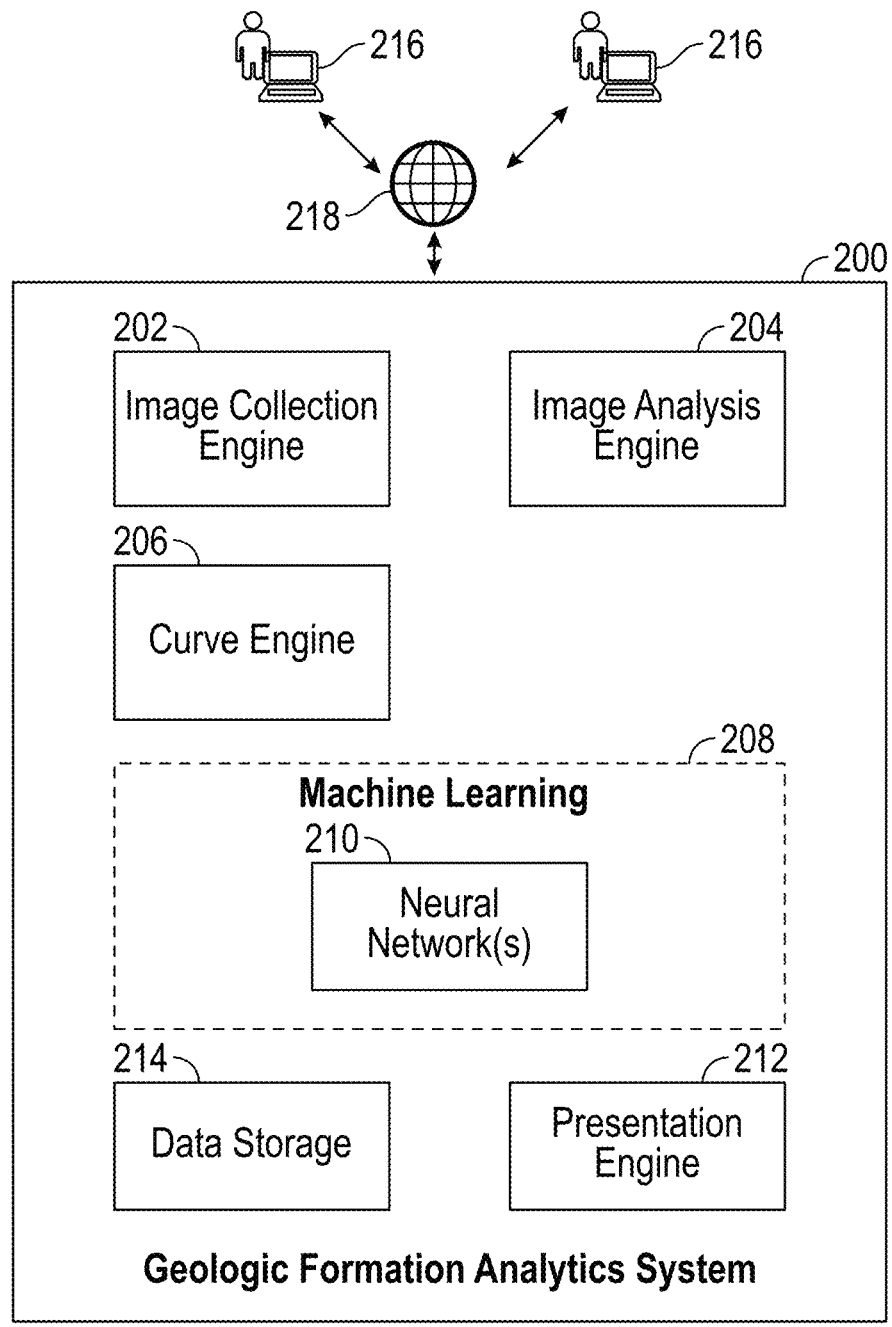
FIG. 10 illustrates an example geologic formation sample analytics system that can be implemented to collect scans of geologic formation samples, analyze the rock textures of the geologic formation samples to extract semantic representations of textures, and generate a curve representing the rock texture for each location within the wellbore.

The data gathered from the methods described above can be stored, for example in data storage 214 shown in FIG. 10, for future reference. In at least one example, a database can be created retaining geologic formation data for certain areas. In at least one example, the database can be searchable such that data relating to specific geologic locations or specific rock textures can be located. Additionally, in at least one example, data storage 214 can also include other properties of the geologic formations, such as those determined using well logs and other analytical methods. Such data can allow for geologic mechanics and other formation properties to be evaluated and extracted with higher confidence.

Based on the methods and systems disclosed herein, operators can make more informed decisions regarding a wellsite and carrying out wellbore operations. For instance, with more knowledge of the formation image and the associated properties, wellbore operations may be adjusted including, drilling operations including drilling rates and direction, fracturing operations, stimulation operations, production operations, secondary operations, diversion operations, hydrocarbon reservoir locating operations, and the like.

Specifically, FIG. 10 illustrates an example geologic formation sample analytics system 200 (hereinafter "system 200") which can be implemented to collect scans of geologic formation samples from one or more locations within a wellbore, analyze the rock texture of the geologic formation samples to extract semantic representation of textures, and generate a curve representing the rock texture for each location within the wellbore. For example, the system 200 can be used to provide an overall evaluation of the rock formations adjacent to the wellbore. As will be further described below, the system 200 can include computerized geologic formation sample evaluation tools which can implement machine learning and image processing technologies for collecting scans, analyzing rock textures, and generating a curve representing the formations.

In at least some examples, the system 200 can include an image collection engine 202. The image collection engine 202 can receive and store images from one or more sources, such as a user input 216, for cropping and designating the location/area within the wellbore, rock texture, or any other user-selected buffer.

An image analysis engine 204 can apply computer vision (e.g., image processing, segmentation, recognition, etc.) and machine learning technology 208 to identify specific rock properties visible in the images collected by the image collection engine 202. Non-limiting examples of rock properties can include, but are not limited to, rock types, rock textures, three-dimensional renderings, and/or any rock properties which may affect the hydrocarbon extraction process. In some cases, the image analysis engine 204 can implement neural network(s) 210 to identify rock properties within the images. The neural networks 210 can allow the image analysis engine 204 to recognize objects in images, as further described with reference to FIG. 4.

The system 200 can also include a curve engine 206 operable to perform one or more mathematical analyses on the data received from the image analysis engine 204 and generate a curve representing the texture of the various rock formations along the length of the wellbore.

A presentation engine 212 can also be included and can use the data from curve engine 206, as well as any other data collected or generated by the system 200, to display the rock classification at one or more locations throughout the wellbore as a graphical or three-dimensional representation. For example, the presentation engine 212 can generate an interface or graphical view of such data for display at one or more display devices (e.g., local display device on the system 200 and/or remote display device on a different system). The presentation engine 212 can configure and/or format the generated data for rendering/presentation based on user preferences, system preferences, system capabilities, type of data being presented, various available formatting options, etc. For example, the presentation engine 212 can format the data in tabular form, geographic or map form based on location within the wellbore, as a chart or graph, in textual form, and/or any other graphical or animated form.

The data storage 214 can be used to store images input by the users 216 as well as images analyzed by the image analysis engine 204, rock textures identified, curve data generated by the curve engine 206, presentation data generated by the presentation engine 210, data, logs, and/or statistics obtained from the Internet 218, and the like. In at least one example, the data storage 214 can be used for storing all information generated by the geologic formation analytics system such that a searchable database is created for future reference.

The system 200 can be part of, or implemented by, one or more computing devices such as, for example and without limitation, one or more servers, laptop computers, tablet computers, etc. In some examples, the system 200 can be implemented by one or more virtualization or execution environments, such as one or more virtual machines, software containers, serverless functions, etc., which can be hosted or implemented by one or more computing devices. Moreover, in some cases, the system 200 and/or components of the system 200 can be implemented by one or more nodes or services provisioned by a network environment such as, for example, a cloud, a datacenter, etc.

Figure 11:
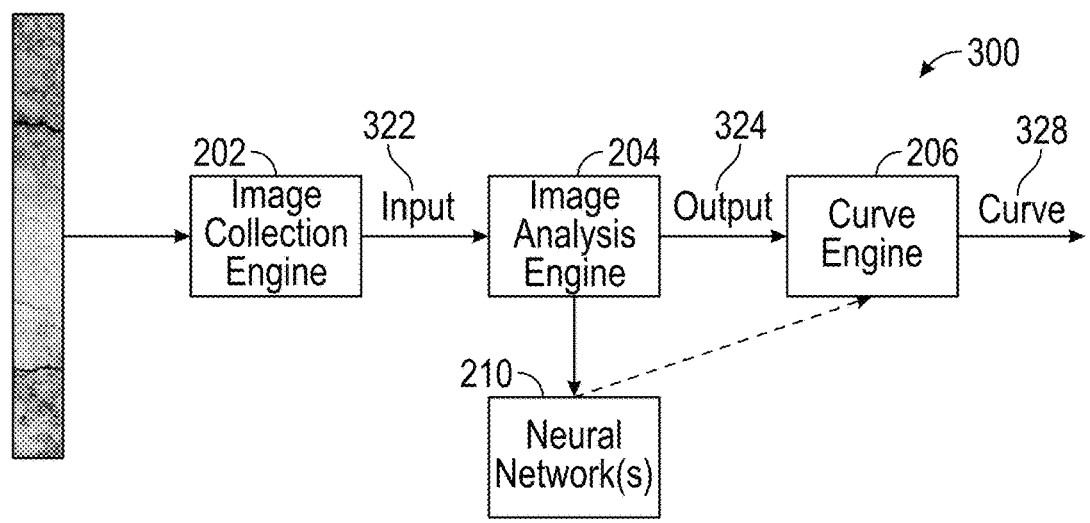
FIG. 11 illustrates an example flow for processing image data to identify rock formation properties and generate texture curves.

FIG. 11 illustrates an example flow for processing image data to identify rock formation properties and generate texture curves. In this example, the image collection engine 202 can receive an image 300, such as a scan or rendering of a geologic formation sample. As described above, the location of the sample can be recorded such that the scan can be correlated to a known location within the wellbore. The image collection engine 202 can obtain the image 300 from one or more sources, such as the Internet 218, data storage 214, a user 216, a remote server, an application, etc. For example, the image 300 can be uploaded to the image collection engine 202 by a user 216. As another example, the image collection engine 202 can obtain the image from data storage 214, where various geologic formation sample scans can be stored. The image collection engine 202 can divide the image 300 into small patches for further analysis.

The image 300, cropped by the image collection engine 202, and any other necessary data including, but not limited to, the location data as described above, can be provided as input 302 to image analysis engine 204. Image analysis engine 204 can use the input 302 to identify rock classifications of sections of geologic formation in the image 300. For example, the image analysis engine 204 can use neural network(s) 210 and computer vision technology to recognize textures in the image 300. For example, the image analysis engine 204 can analyze patches (e.g., pixels and/or regions) in the image 300 and intelligently recognize semantic features in the patches based on identified patterns and/or attributes.

The image analysis engine 204 can generate output 304 which can include recognized rock formation textures from the image 300. Curve engine 206 can receive the output 304 from the image analysis engine 204 and use the recognized rock formation textures in the output 304 to generate a texture curve 308. The curve 208 can identify textures present in the rock formation of the geologic formation sample to generate curves. The curves can include continuous values representing the textures of the rock formation. In some examples, the curves can be rendered/presented on a display by the presentation engine 212.

Figure 12:
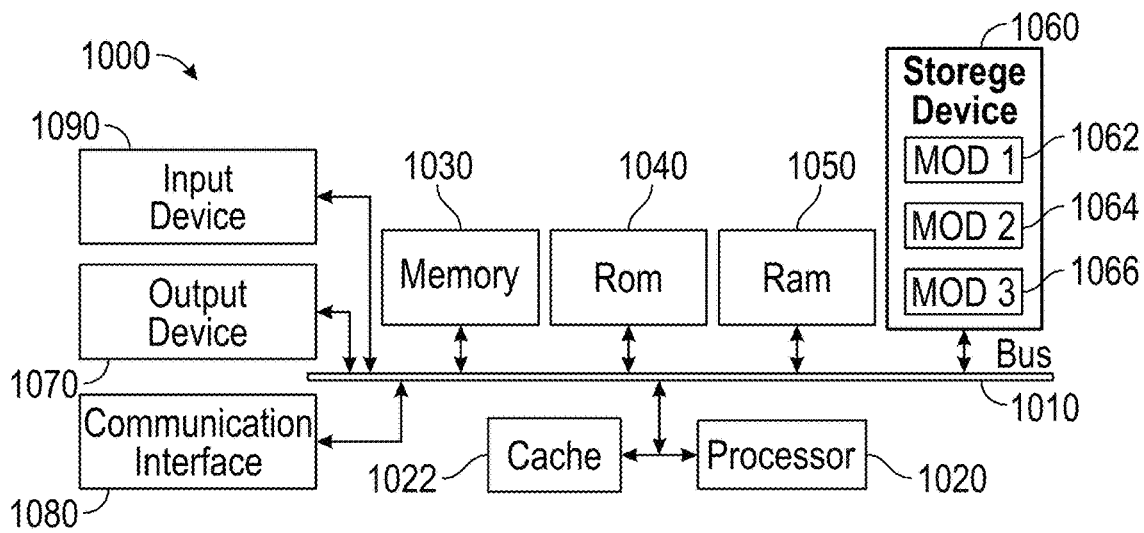
FIG. 12 is an illustration depicting an example system bus computing system architecture, according to an exemplary embodiment.
Figure 13:
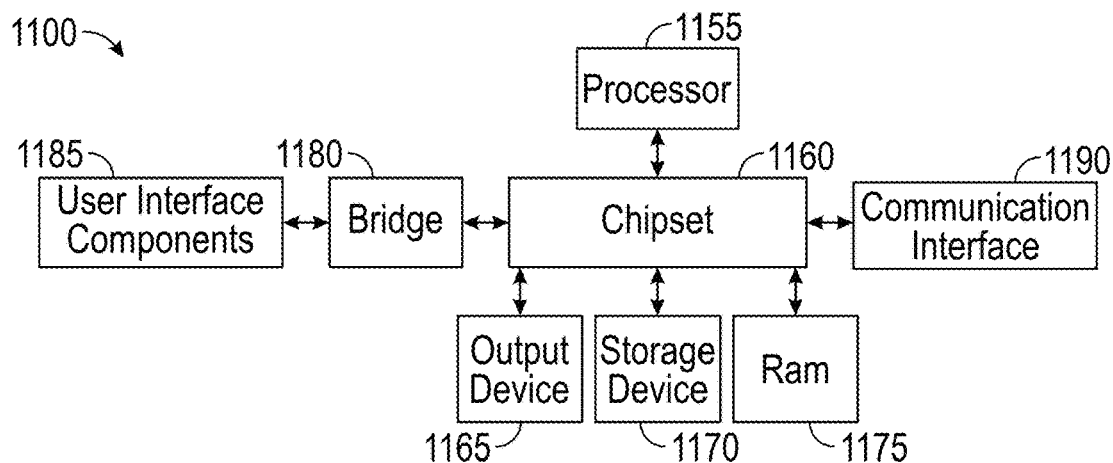
FIG. 13 is an illustration depicting a computer system having a chipset architecture, according to an exemplary embodiment.

The above described methods can be implemented using electronic hardware, as shown and described in FIGS. 12 and 13. Whether such elements are implemented as hardware or software depends upon the particular application and design constraints imposed on the overall system.

Specifically, FIG. 12 illustrates an example system bus computing system architecture 1000 wherein the components of the system are in electrical communication with each other using a bus 1010. System 1000 can include a processing unit (CPU or processor) 1020 and a system bus 1010 that couples various system components including the system memory 1030, such as read only memory (ROM) 1040 and random access memory (RAM) 1050, to the processor 1020. The system 1000 can include a cache of high-speed memory connected directly with, in close proximity to, or integrated as part of the processor 1020. The system 1000 can copy data from the memory 1030 and/or the storage device 1060 to the cache 1022 for quick access by the processor 1020. In this way, the cache 1022 can provide a performance boost that avoids processor 1020 delays while waiting for data. These and other modules can control or be configured to control the processor 1020 to perform various actions. Other system memory 1030 may be available for use as well. The memory 1030 can include multiple different types of memory with different performance characteristics. It can be appreciated that the disclosure may operate on a computing device 1000 with more than one processor 1020 or on a group or cluster of computing devices networked together to provide greater processing capability. The processor 1020 can include any general purpose processor and a hardware module or software module, such as first module 1062, second module 1064, and third module 1066 stored in storage device 1060, configured to control the processor 1020 as well as a special-purpose processor where software instructions are incorporated into the actual processor design. The processor 1020 may essentially be a completely self-contained computing system, containing multiple cores or processors, a bus, memory controller, cache, etc. A multi-core processor may be symmetric or asymmetric.

The system bus 1010 may be any of several types of bus structures including a memory bus or a memory controller, a peripheral bus, and a local bus using any of a variety of bus architectures. A basic input/output (BIOS) stored in ROM 1040 or the like, may provide the basic routine that helps to transfer information between elements within the computing device 1000, such as during start-up. The computing device 1000 further includes storage devices 1060 or computer-readable storage media such as a hard disk drive, a magnetic disk drive, an optical disk drive, tape drive, solid-state drive, RAM drive, removable storage devices, a redundant array of inexpensive disks (RAID), hybrid storage device, or the like. The storage device 1060 can include software modules 1062, 1064, 1066 for controlling the processor 1020. The system 1000 can include other hardware or software modules. The storage device 1030 is connected to the system bus 1010 by a drive interface. The drives and the associated computer-readable storage devices provide non-volatile storage of computer-readable instructions, data structures, program modules and other data for the computing device 1000. In one aspect, a hardware module that performs a particular function includes the software components shorted in a tangible computer-readable storage device in connection with the necessary hardware components, such as the processor 1020, bus 1010, and so forth, to carry out a particular function. In the alternative, the system can use a processor and computer-readable storage device to store instructions which, when executed by the processor, cause the processor to perform operations, a method or other specific actions. The basic components and appropriate variations can be modified depending on the type of device, such as whether the device 1000 is a small, handheld computing device, a desktop computer, or a computer server. When the processor 1020 executes instructions to perform "operations", the processor 1020 can perform the operations directly and/or facilitate, direct, or cooperate with another device or component to perform the operations.

To enable user interaction with the computing device 1000, an input device 1090 can represent any number of input mechanisms, such as a microphone for speech, a touch-sensitive screen for gesture or graphical input, keyboard, mouse, motion input, speech and so forth. An output device 1070 can also be one or more of a number of output mechanisms known to those of skill in the art. In some instances, multimodal systems can enable a user to provide multiple types of input to communicate with the computing device 1020. The communications interface 1080 can generally govern and manage the user input and system output. There is no restriction on operating on any particular hardware arrangement and therefore the basic features here may easily be substituted for improved hardware or firmware arrangements as they are developed.

Storage device 1060 is a non-volatile memory and can be a hard disk or other types of computer readable media which can store data that are accessible by a computer, such as magnetic cassettes, flash memory cards, solid state memory devices, digital versatile disks (DVDs), cartridges, RAMS 1050, ROM 1040, a cable containing a bit stream, and hybrids thereof.

The logical operations for carrying out the disclosure herein may include: (1) a sequence of computer implemented steps, operations, or procedures running on a programmable circuit with a general use computer, (2) a sequence of computer implemented steps, operations, or procedures running on a specific-use programmable circuit; and/or (3) interconnected machine modules or program engines within the programmable circuits. The system 1000 shown in FIG. 10 can practice all or part of the recited methods, can be a part of the recited systems, and/or can operate according to instructions in the recited tangible computer readable storage devices.

One or more parts of the example computing device 1000, up to and including the entire computing device 1000, can be virtualized. For example, a virtual processor can be a software object that executes according to a particular instruction set, even when a physical processor of the same type as the virtual processor is unavailable. A virtualization layer or a virtual "host" can enable virtualized components of one or more different computing devices or device types by translating virtualized operations to actual operations. Ultimately however, virtualized hardware of every type is implemented or executed by some underlying physical hardware. Thus, a virtualization compute layer can operate on top of a physical compute layer. The virtualization compute layer can include one or more of a virtual machine, an overlay network, a hypervisor, virtual switching, and any other virtualization application.

The processor 1020 can include all types of processors disclosed herein, including a virtual processor. However, when referring to a virtual processor, the processor 1020 includes the software components associated with executing the virtual processor in a virtualization layer and underlying hardware necessary to execute the virtualization layer. The system 1000 can include a physical or virtual processor 1020 that receives instructions stored in a computer-readable storage device, which causes the processor 1020 to perform certain operations. When referring to a virtual processor 1020, the system also includes the underlying physical hardware executing the virtual processor 1020.

FIG. 13 illustrates an example computer system 1150 having a chipset architecture that can be used in executing the described method and generating and displaying a graphical user interface (GUI). Computer system 1150 can include computer hardware, software, and firmware that can be used to implement the disclosed technology. System 1150 can include a processor 1155, representative of any number of physically and/or logically distinct resources capable of executing software, firmware, and hardware configured to perform identified computations. Processor 1155 can communicate with a chipset 1160 that can control input to and output from processor 1155. Chipset 1160 can output information to output device 1165, such as a display, and can read and write information to storage device 1170, which can include magnetic media, and solid state media Chipset 1160 can also read data from and write data to RAM 1175. A bridge 1180 for interfacing with a variety tot user interface components 1185 can include a keyboard, a microphone, touch detection and processing circuitry, a pointing device, such as a mouse, and so on. In general, inputs to system 1150 can come from any of a variety of sources, machine generated and/or human generated.

Chipset 1160 can also interface with one or more communication interfaces 1190 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 1155 analyzing data stored in storage 1170 or RAM 1175. Further, the machine can receive inputs from a user via, user interface components 1185 and execute appropriate functions, such as browsing functions by interpreting these inputs using processor 1155.

It can be appreciated that systems 1000 and 1100 can have more than one processor 1020,1155 or be part of a group or cluster of computing devices networked together to provide processing capability. For example, the processor 1020,1155 can include multiple processors, such as a system having multiple, physically separate processors in different sockets, or a system having multiple processor cores on a single physical chip. Similarly, the processor 1020 can include multiple distributed processors located in multiple separate computing devices, but working together such as via a communications network. Multiple processors or processor cores can share resources such as memory 1030 or the cache 1022, or can operate using independent resources. The processor 1020 can include one or more of a state machine, an application specific integrated circuit (ASIC), or a programmable gate array (PGA) including a field PGA.

Methods according to the aforementioned description can be implemented using computer-executable instructions that are stored or otherwise available from computer readable media. Such instructions can comprise instructions and data which cause or otherwise configured a general purpose computer, special purpose computer, or special purpose processing device to perform a certain function or group of functions, portions of computer resources used can be accessible over a network. The computer executable instructions may be binaries, intermediate format instructions such as assembly language, firmware, or source code. Computer-readable media that may be used to store instructions, information used, and/or information created during methods according to the aforementioned description include magnetic or optical disks, flash memory, USB devices provided with non-volatile memory, networked storage devices, and so on.

For clarity of explanation, in some instances the present technology may be presented as including individual functional blocks including functional blocks comprising devices, device components, steps or routines in a method embodied in software, or combinations of hardware and software. The functions these blocks represent may be provided through the use of either shared or dedicated hardware, including, but not limited to, hardware capable of executing software and hardware, such as a processor 1020, that is purpose-built to operate as an equivalent to software executing on a general purpose processor. For example, the functions of one or more processors represented in FIG. 10 may be provided by a single shared processor or multiple processors. (use of the term "processor" should not be construed to refer exclusively to hardware capable of executing software.) Illustrative embodiments may include microprocessor and/or digital signal processor (DSP) hardware, ROM 1040 for storing software performing the operations described below, and RAM 1050 for storing results. Very large scale integration (VLSI) hardware embodiments, as well as custom VLSI circuitry in combination with a general purpose DSP circuit, may also be provided.

The computer-readable storage devices, mediums, and memories can include a cable or wireless signal containing a hit stream and the like. However, when mentioned, non-transitory computer-readable storage media expressly exclude media such as energy, carrier signals, electromagnetic waves, and signals per se.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hard-wired links, wireless links, or by a combination thereof) through a communications network. In a distributed computing environment, program modules may be located in both local and remote memory storage devices.

Numerous examples are provided herein to enhance understanding of the present disclosure. A specific set of statements are provided as follows.

Statement 1: A method for analyzing geological formation properties, comprising: receiving an image a formation sample; partitioning the image into a plurality of patches; of detecting, via a semantic extraction processor, textures captured in the plurality of patches; associating the textures to a location of the image of the formation sample; reducing a dimension of representation of the textures to obtain one or more vectors, the one or more vectors being based on the textures; and providing a plurality of curves based on the one or more vectors.

Statement 2: The method of Statement 1, further comprising imaging the formation sample.

Statement 3: The method of Statements 1 or 2, further comprising extracting the formation sample from a wellbore.

Statement 4: The method of any one of the preceding Statements 1-3, wherein the formation sample is extracted by a core sample collection tool coupled to a conveyance, a sampling-while-drilling tool, or by forming cuttings by drilling and circulating cuttings to a surface.

Statement 5: The method of any one of the preceding Statements 1-4, wherein the semantic extraction processor is a neural network.

Statement 6: The method of any one of the preceding Statements 1-5, wherein the neural network comprises a convolutional neural network.

Statement 7: The method of any one of the preceding Statements 1-6, further comprising providing the plurality of curves adjacent the image of the formation sample.

Statement 8: The method of any one of the preceding Statements 1-7, further comprising dividing the image of the formation sample into texture segments.

Statement 9: The method of any one of the preceding Statements 1-8, wherein each patch from the plurality of patches comprises one or more pixels associated with the image.

Statement 10: The method of Statement 9, wherein each texture represents a classification of formation rock type.

Statement 11: The method of any one of the preceding Statements 1-10, further comprising determining a statistical representation of the plurality of patches in a horizontal direction based on the textures.

Statement 12: The method of any one of the preceding Statements 1-11, wherein each of the one or more vectors comprises at least two components.

Statement 13: The method of any one of the preceding Statements 1-12, wherein the at least two components comprise a semantic feature representation and one or more associated location parameters, the semantic feature representation comprising a texture classification.

Statement 14: A system comprising: one or more processors; and at least one non-transitory computer-readable medium having stored therein instructions which, when executed by the one or more processors, cause the system to: receive an image of a formation sample; partition the image into a plurality of patches; detect textures captured in the plurality of patches; associate the textures to a location of the image of the formation sample; reduce a dimension of representation of the textures to obtain one or more vectors, the one or more vectors being based on the textures; and provide a plurality of curves based on the one or more vectors.

Statement 15: The system of Statements 14, wherein the textures are detected via a neural network, the neural network comprising a convolutional neural network.

Statement 16: The system of Statements 14 or 15, the at least one non-transitory computer-readable medium having stored therein instructions which, when executed by the one or more processors, cause the system to render the plurality of curves and the image of the formation sample.

Statement 17: The system of any one of the preceding Statements 14-16, wherein each patch from the plurality of patches comprises one or more pixels associated with the image, and wherein each texture represents a classification of formation rock type.

Statement 18: The system of any one of the preceding Statements 14-17, the at least one non-transitory computer-readable medium having stored therein instructions which, when executed by the one or more processors, cause the system to determine a statistical representation of the plurality of patches in a horizontal direction based on the textures.

Statement 19: The system of any one of the preceding Statements 14-18, wherein each of the one or more vectors comprises at, least two components, the at least two components comprising a semantic feature representation and one or more associated location parameters, the semantic feature representation comprising a texture classification associated with a respective texture.

Statement 20: A non-transitory computer-readable medium having stored therein instructions which, when executed by one or more processors, cause the one or more processors to: receive an image of a formation sample; partition the image into a plurality of patches; detect textures captured in the plurality of patches; associate the textures to a location of the image of the formation sample; reduce a dimension of representation of the textures to obtain one or more vectors, the one or more vectors being based on the textures; and provide a plurality of curves based on the one or more vectors.

Statement 21: The non-transitory computer-readable medium of Statement 20, wherein the textures are detected via a convolutional neural network, wherein each patch from the plurality of patches comprises one or more pixels associated with the image, and wherein each texture represents a classification of formation rock type.

Statement 22: The non-transitory computer-readable medium of Statements 21 or 22, storing instructions which, when executed by the one or more processors, cause the one or more processors to: determine a statistical representation of the plurality of patches in a horizontal direction based on the textures; and present the plurality of curves and the image of the formation sample.

Statement 23: The non-transitory computer-readable medium of any one of the preceding Statements 20-22, wherein each of the one or more vectors comprises at least two components, the at least two components comprising a semantic feature representation and one or more associated location parameters, the semantic feature representation comprising a texture classification associated with a respective texture.

What is claimed is:

1. A computer-implemented method for analyzing geological formation properties, comprising:
   receiving, via a processor, an image of a training sample;
   partitioning, via the processor, the image of the training sample into a first plurality of patches;
   receiving, via the processor, input including an identification of a texture for each patch of the first plurality of patches;
   training, via the processor, a neural network with the plurality of patches and identified textures;
   receiving, via the processor, an image of a formation sample to be evaluated;
   partitioning, via the processor, the image of the formation sample into a second plurality of patches; and
   for each patch of the second plurality of patches:
      providing, via the processor, the patch as an input to the neural network;
      obtaining, via the processor, values from an output layer of the neural network for the patch, the values of the output layer representing semantic features of the patch in a first number of dimensions;
      associating, via the processor, the patch to a location of the image of the formation sample; and
      reducing, via the processor, the first number of dimensions representing the semantic features of the patch to obtain a vector corresponding to the patch having a second number of dimensions; and
   generating, via the processor, a plurality of curves, one curve being displayed for each of the second number of dimensions, each curve being a two-dimensional graph with one axis corresponding to a position along the formation sample at which the patch is located and the second axis corresponding to a respective dimension of the vector for the corresponding patch;
   displaying, via the processor, the plurality of curves on a display device.

2. The method of claim 1, further comprising imaging the formation sample.

3. The method of claim 1, further comprising extracting the formation sample from a wellbore.

4. The method of claim 1, wherein the formation sample is extracted by a core sample collection tool coupled to a conveyance, a sampling-while-drilling tool, or by forming cuttings by drilling and circulating cuttings to a surface.

5. The method of claim 1, wherein the neural network comprises a convolutional neural network.

6. The method of claim 1, further comprising displaying the plurality of curves adjacent the image of the formation sample.

7. The method of claim 1, further comprising dividing the image of the formation sample into texture segments.

8. The method of claim 1, wherein each patch from the plurality of patches comprises a plurality of pixels associated with the image.

9. The method of claim 1, wherein each texture represents a classification by the expert of a formation rock type.

10. The method of claim 1, further comprising determining a statistical representation of the plurality of patches in a horizontal direction based on the textures.

11. The method of claim 1, wherein each of the vectors comprises at least two components.

12. The method of claim 11, wherein the at least two components comprise a semantic feature representation and one or more associated location parameters, the semantic feature representation comprising a texture classification.

13. A system comprising:
   one or more processors; and
   at least one non-transitory computer-readable medium having stored therein instructions which, when executed by the one or more processors, cause the system to:
   receive an image of a training sample;
   partition the image of the training sample into a first plurality of patches;
   receive input including an identification of a texture for each patch of the first plurality of patches;
   train a neural network with the plurality of patches and identified textures;
   receive an image of a formation sample to be evaluated;
   partition the image of the formation sample into a second plurality of patches; and
   for each patch of the second plurality of patches:
      provide the patch as an input to the neural network;
      obtain values from an output layer of the neural network for the patch, the values of the output layer representing semantic features of the patch in a first number of dimensions;
      associate the patch to a location of the image of the formation sample; and
      reduce the first number of dimensions representing the semantic features of the patch to obtain a vector corresponding to the patch having a second number of dimensions; and
   display a plurality of curves, one curve being displayed for each of the second number of dimensions, each curve being displayed as a two-dimensional graph with one axis corresponding to a position along the formation sample at which the patch is located and the second axis corresponding to a respective dimension of the vector for the corresponding patch.

14. The system of claim 13, wherein neural network comprises a convolutional neural network.

15. The system of claim 13, the at least one non-transitory computer-readable medium having stored therein instructions which, when executed by the one or more processors, cause the system to render the plurality of curves and the image of the formation sample.

16. The system of claim 13, wherein each patch from the plurality of patches comprises a plurality of pixels associated with the image, and wherein each texture represents a classification by the expert of a formation rock type.

17. The system of claim 13, the at least one non-transitory computer-readable medium having stored therein instructions which, when executed by the one or more processors, cause the system to determine a statistical representation of the plurality of patches in a horizontal direction based on the textures.

18. The system of claim 13, wherein each of the one or more vectors comprises at least two components, the at least two components comprising a semantic feature representation and one or more associated location parameters, the semantic feature representation comprising a texture classification associated with a respective texture.

19. A non-transitory computer-readable medium having stored therein instructions which, when executed by one or more processors, cause the one or more processors to:
receive an image of a training sample;
partition the image of the training sample into a first plurality of patches;
receive input including an identification of a texture for each patch of the first plurality of patches;
train a neural network with the plurality of patches and identified textures;
receive an image of a formation sample to be evaluated;
partition the image of the formation sample into a second plurality of patches; and
for each patch of the second plurality of patches:
provide the patch as an input to the neural network;
obtain values from an output layer of the neural network for the patch, the values of the output layer representing semantic features of the patch in a first number of dimensions;
associate the patch to a location of the image of the formation sample; and
reduce the first number of dimensions representing the semantic features of the patch to obtain a vector corresponding to the patch having a second number of dimensions; and
display a plurality of curves, one curve being displayed for each of the second number of dimensions, each curve being displayed as a two-dimensional graph with one axis corresponding to a position along the formation sample at which the patch is located and the second axis corresponding to a respective dimension of the vector for the corresponding patch.

20. The non-transitory computer-readable medium of claim 19, wherein the textures are detected via a convolutional neural network, wherein each patch from the plurality of patches comprises a plurality of pixels associated with the image, and wherein each texture represents a classification by the expert of a formation rock type.

21. The non-transitory computer-readable medium of claim 19, storing instructions which, when executed by the one or more processors, cause the one or more processors to:
determine a statistical representation of the plurality of patches in a horizontal direction based on the textures; and
present the plurality of curves and the image of the formation sample.

22. The non-transitory computer-readable medium of claim 19, wherein each of the one or more vectors comprises at least two components, the at least two components comprising a semantic feature representation and one or more associated location parameters, the semantic feature representation comprising a texture classification associated with a respective texture.

* * * * *